(12) United States Patent
Chen et al.

(10) Patent No.: US 8,237,197 B2
(45) Date of Patent: Aug. 7, 2012

(54) ASYMMETRIC CHANNEL MOSFET

(75) Inventors: Xiangdong Chen, Poughquag, NY (US);
Jie Deng, Hopewell Junction, NY (US);
Weipeng Li, Beacon, NY (US); Deleep R. Nair, Fishkill, NY (US); Jae-Eun Park, Wappingers Falls, NY (US);
Daniel Tekleab, Wappingers Falls, NY (US); Xiaobin Yuan, Carmel, NY (US);
Nam Sung Kim, Hopewell Junction, NY (US)

(73) Assignees: International Business Machines Corporation, Armonk, NY (US);
Globalfoundries Inc., Grand Cayman (KY)

( * ) Notice: Subject to any disclaimer, the term of this patent is extended or adjusted under 35 U.S.C. 154(b) by 113 days.

(21) Appl. No.: 12/831,310

(22) Filed: Jul. 7, 2010

(65) Prior Publication Data

US 2012/0007145 A1    Jan. 12, 2012

(51) Int. Cl.
*H01L 29/66* (2006.01)

(52) U.S. Cl. ... 257/194; 257/18; 257/255; 257/E29.246; 257/E21.403; 257/E21.427; 438/285; 438/286

(58) Field of Classification Search .................. 257/194, 257/18, 255, E29.246, E21.403, E21.427; 438/285, 286
See application file for complete search history.

(56) References Cited

U.S. PATENT DOCUMENTS

| | | | |
|---|---|---|---|
| 6,180,502 B1 | 1/2001 | Liang | |
| 6,297,104 B1 | 10/2001 | Tyagi et al. | |
| 6,458,666 B2 | 10/2002 | Wasshuber | |
| 6,744,083 B2 | 6/2004 | Chen et al. | |
| 6,979,622 B1 | 12/2005 | Thean et al. | |
| 7,524,733 B2 | 4/2009 | Seo et al. | |
| 7,585,735 B2 | 9/2009 | Mathew et al. | |
| 2005/0230717 A1* | 10/2005 | Shima | 257/288 |
| 2008/0057635 A1 | 3/2008 | Chen | |

OTHER PUBLICATIONS

Kim, D. et al., "Band to Band Tunneling Study in High Mobility Materials:III-V, Si, Ge and Strained SiGe" 65th Annual Device Research Conference (2007) pp. 57-58.

Saraswat, K.C. et al., "High Mobility Materials and Novel Device Structures for High Performance Nanoscale MOSFETs" IEDM (2006) pp. 659-662.

Chen, X. et al., "A Cost Effective 32nm High-K/Metal Gate CMOS Technology for Low Power Applications with Single-Metal/Gate-First Process" Symposium on VLSI Technology Digest of Technical Papers (2008) pp. 88-89.

Srivastava, A. et al., "Effect of High-K Gate Dielectrics on Channel Engineered Deep Sub-Micrometer n-MOSFET Device" Microelectronis (2008) pp. 507-510.

* cited by examiner

*Primary Examiner* — Tu-Tu Ho
(74) *Attorney, Agent, or Firm* — Scully, Scott, Murphy & Presser, P.C.; Yuanmin Cai

(57) ABSTRACT

A field effect transistor includes a partial SiGe channel, i.e., a channel including a SiGe channel portion, located underneath a gate electrode and a Si channel portion located underneath an edge of the gate electrode near the drain region. The SiGe channel portion can be located directly underneath a gate dielectric, or can be located underneath a Si channel layer located directly underneath a gate dielectric. The Si channel portion is located at the same depth as the SiGe channel portion, and contacts the drain region of the transistor. By providing a Si channel portion near the drain region, the GIDL current of the transistor is maintained at a level on par with the GIDL current of a transistor having a silicon channel only during an off state.

20 Claims, 20 Drawing Sheets

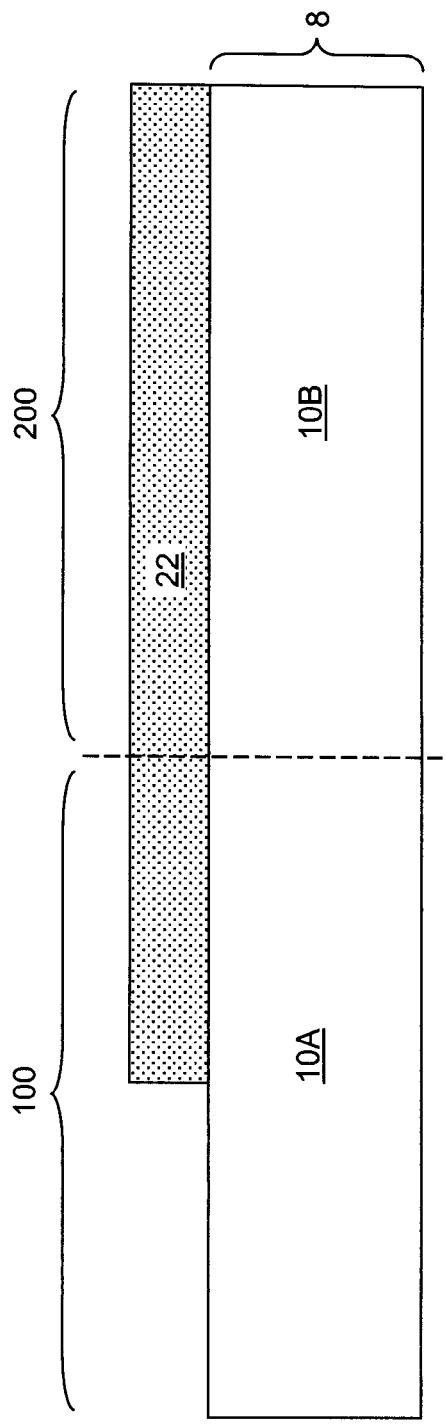
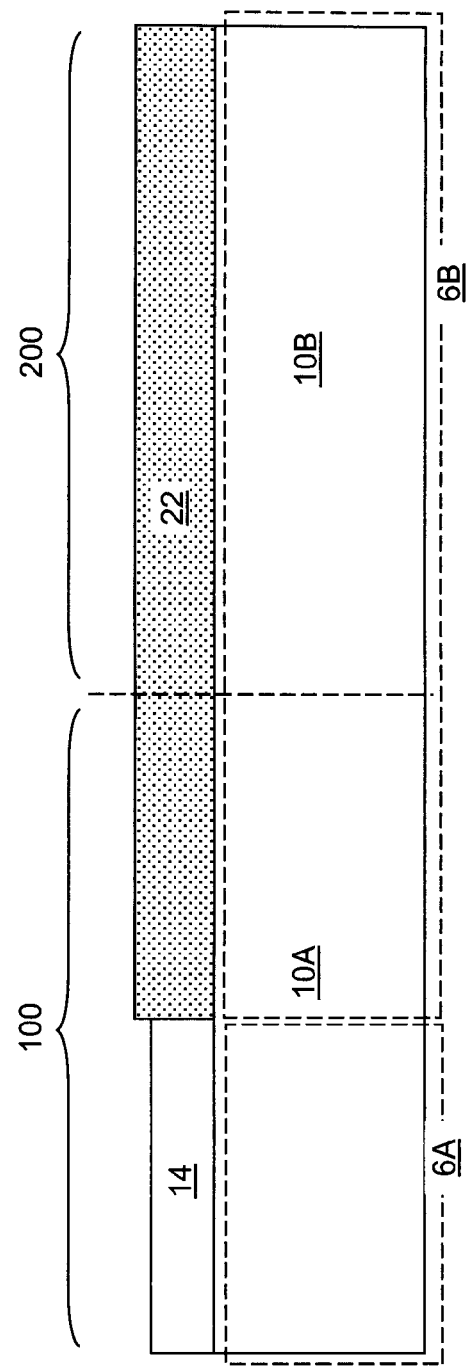

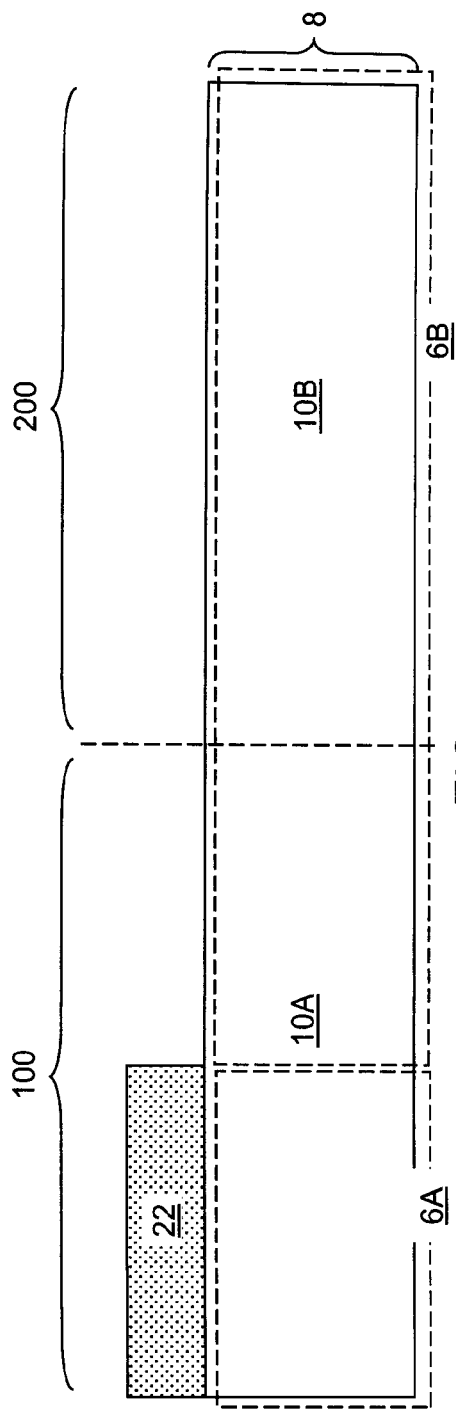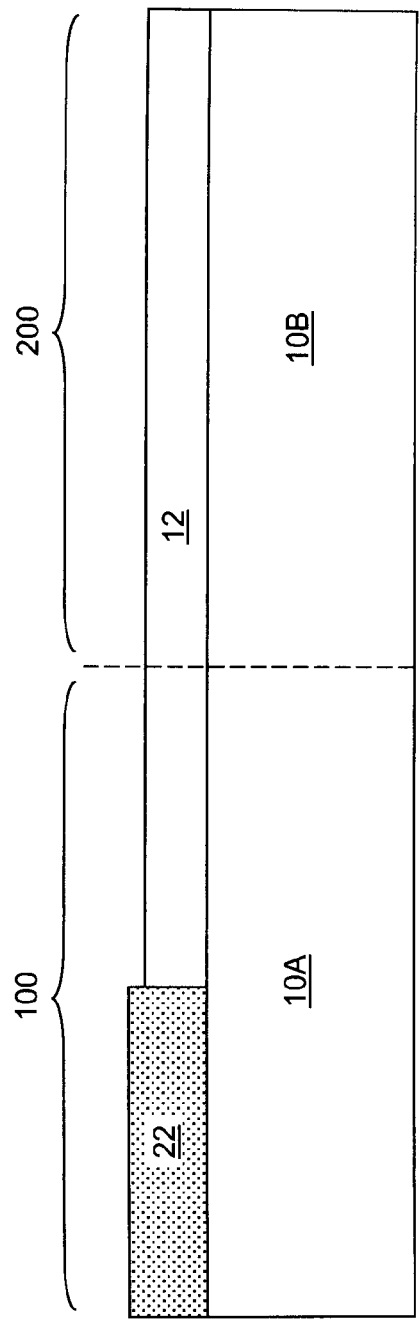

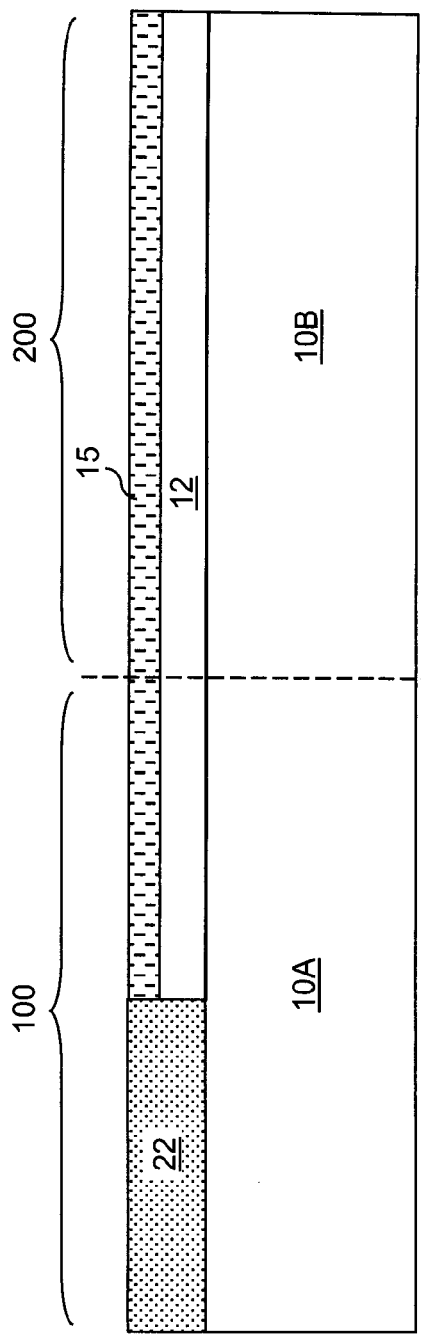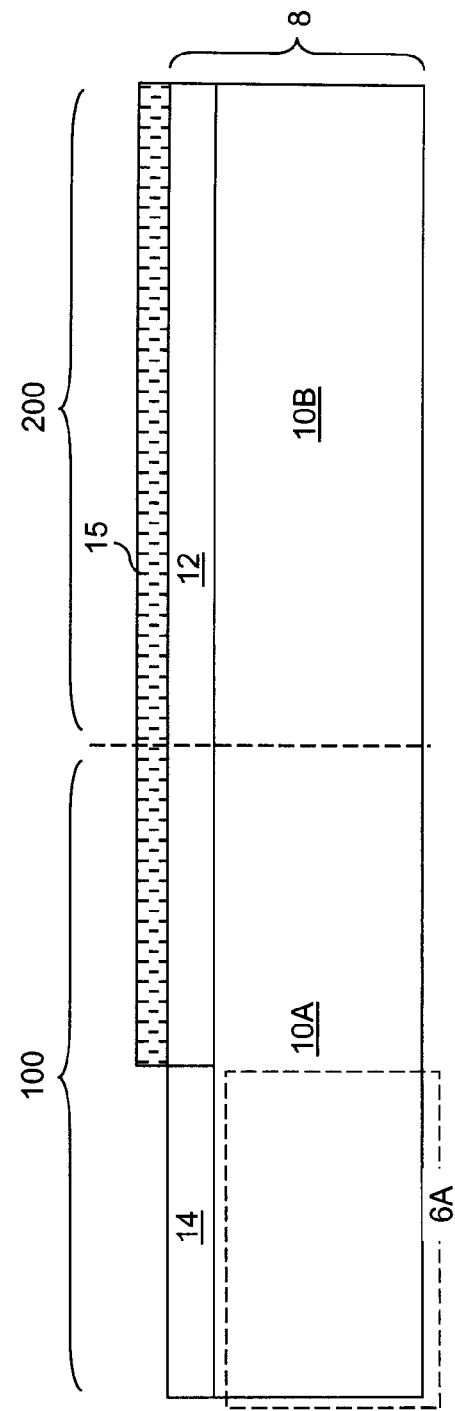

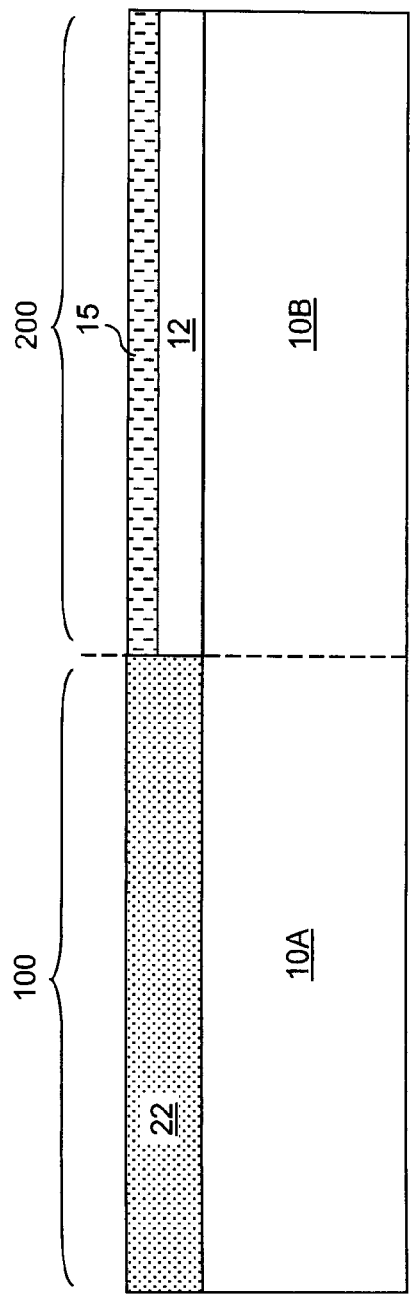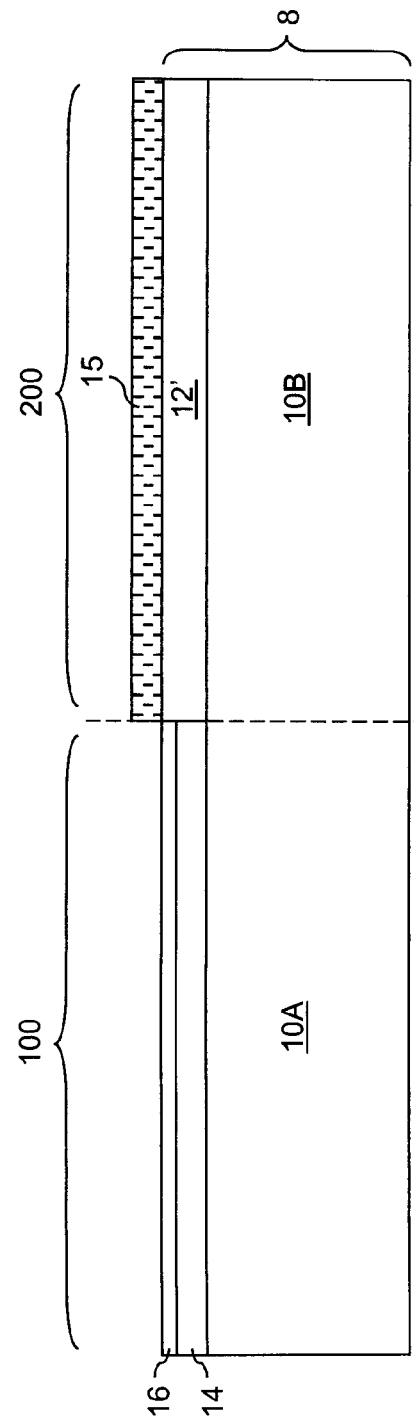

ASYMMETRIC CHANNEL MOSFET

BACKGROUND

The present invention relates to semiconductor structures, and more particularly to field effect transistor structures having an asymmetric SiGe channel, and methods of manufacturing the same.

A SiGe channel, i.e., a channel composed of a silicon-germanium alloy, provides a smaller band gap than a channel composed of silicon in a metal-oxide-semiconductor field effect transistor (MOSFET). The SiGe channel can be advantageously employed, for example, in combination with a high-k gate dielectric and a metal gate electrode thereupon to provide an optimized band gap in field effect transistors. However, the reduction in the band gap induces gate-induced drain leakage (GIDL) current in field effect transistors employing a SiGe channel. Such increase in the GIDL current has been observed, for example, in Dongyun Kim et al., "Band to Band Tunneling Study in High Mobility Materials: III-V, Si, Ge and strained SiGe," Device Research Conference, pp. 57-58 (2007), Krishna C. Saraswat et al., "High Mobility Materials and Novel Device Structures for High Performance Nanoscale MOSFETs," IDEM (2007), and X. Chen et al., "A cost Effective 32 nm High-k/Metal Gate CMOS Technology for Low Power Applications with Single-Metal/Gate-First Processes, IEEE VLSI pp. 88-89.

Such increase in the GIDL current due to a SiGe channel has a negative impact on the performance of a field effect transistor by increasing off-current of the field effect transistor, thereby rendering the field effect transistor unsuitable for low power applications. In order to fully utilize the advantage of a SiGe channel in providing a well controlled threshold voltage, the GIDL current of the transistor needs to be controlled to a minimal level.

BRIEF SUMMARY

A field effect transistor according to embodiments of the instant invention includes a partial SiGe channel, i.e., a channel including a SiGe channel portion, located underneath a gate electrode and a Si channel portion located underneath an edge of the gate electrode near the drain region. The SiGe channel portion can be located directly underneath a gate dielectric, or can be located underneath a Si channel layer located directly underneath a gate dielectric. The SiGe channel portion can extend into a source region of the transistor, or can be confined only within a body region of the transistor. The Si channel portion is located at the same depth as the SiGe channel portion, and contacts the drain region of the transistor. By providing a Si channel portion near the drain region, the GIDL current of the transistor is maintained at a level on par with the GIDL current of a transistor having a silicon channel only during an off state. At the same time, the SiGe channel portion provides a reduced band gap for controlling the threshold voltage of the transistor so that the threshold voltage of the transistor is the same as that transistor having a SiGe channel only.

According to an aspect of the present invention, a semiconductor structure including a field effect transistor is provided. The field effect transistor contains: a source region located in a semiconductor substrate and including a doped SiGe source portion and a doped Si source portion contacting a bottom surface of the doped SiGe source portion; a drain region located in the semiconductor substrate and including an upper doped Si drain portion and a lower doped Si drain portion; and a body region including a SiGe body portion contacting the doped SiGe source portion, an Si body portion laterally contacting the upper doped Si drain portion, and an underlying Si body portion contacting the doped Si source portion and the lower doped Si drain portion.

According to another aspect of the present invention, another semiconductor structure including a field effect transistor is provided. The field effect transistor including a body region including a buried SiGe body portion, an upper Si body portion contacting an upper surface of the buried SiGe body portion, a source-side Si body portion laterally contacting the buried SiGe body portion and a source region, a drain-side Si body portion laterally contacting the buried SiGe body portion and a drain region, and an underlying body portion located beneath the buried SiGe body portion, the source-side Si body portion, and the drain-side Si body portion.

According to yet another aspect of the present invention, a method of forming a semiconductor structure is provided, which includes: forming a silicon-germanium layer on a first portion of a semiconductor substrate; forming a silicon layer on a second portion of a semiconductor substrate, wherein the second portion is a complementary portion of the first portion of the semiconductor substrate; forming a gate dielectric straddling over a boundary between the silicon-germanium layer and the silicon layer; and forming a field effect transistor including the gate dielectric, wherein a source region of the field effect transistor includes a doped portion of the silicon-germanium layer, and a drain region of the field effect transistor includes a doped portion of the silicon layer.

According to still another aspect of the present invention, a method of forming a semiconductor structure is provided, which includes: forming a stack including, from bottom to top, a silicon-germanium layer and a silicon layer on a portion of a semiconductor substrate; forming a gate stack and a dielectric gate spacer laterally surrounding the gate stack on a portion of the silicon layer; removing at least one portion of the silicon layer employing at least the dielectric gate spacer and the gate stack gate as an etch mask to expose a surface of the silicon-germanium layer; removing at least one portion of the silicon-germanium layer selective to silicon to form at least one recessed region, wherein a portion of the silicon-germanium layer remains underneath a gate dielectric of the gate stack; forming at least one epitaxial silicon portion by filling the at least one recessed region by selective epitaxy of silicon; and forming at least a drain region by implanting dopants into the at least one epitaxial silicon portion, wherein the drain region does not contact the remaining portion of the silicon-germanium layer.

BRIEF DESCRIPTION OF THE SEVERAL VIEWS OF THE DRAWINGS

FIG. 1 is a vertical cross-sectional view of a first exemplary semiconductor structure after formation of a dielectric masking layer according to a first embodiment of the present invention.

FIG. 2 is a vertical cross-sectional view of the first exemplary semiconductor structure after formation of an epitaxial silicon layer according to the first embodiment of the present invention.

FIG. 7 is a vertical cross-sectional view of a variation of the first exemplary semiconductor structure after formation of a dielectric masking layer according to the first embodiment of the present invention.

FIG. 8 is a vertical cross-sectional view of the variation of first exemplary semiconductor structure after formation of an epitaxial silicon layer according to the first embodiment of the present invention.

FIG. 9 is a vertical cross-sectional view of the variation of the first exemplary semiconductor structure after formation of a surface dielectric layer according to the first embodiment of the present invention.

FIG. 10 is a vertical cross-sectional view of the variation of the first exemplary semiconductor structure after formation of an epitaxial silicon-germanium layer according to the first embodiment of the present invention.

FIG. 13 is a vertical cross-sectional view of the second exemplary semiconductor structure after formation of a surface dielectric layer according to the second embodiment of the present invention.

FIG. 14 is a vertical cross-sectional view of the second exemplary semiconductor structure after formation of a vertical stack of an epitaxial silicon-germanium layer and a second epitaxial silicon layer according to the second embodiment of the present invention.

DETAILED DESCRIPTION

Figure 3:
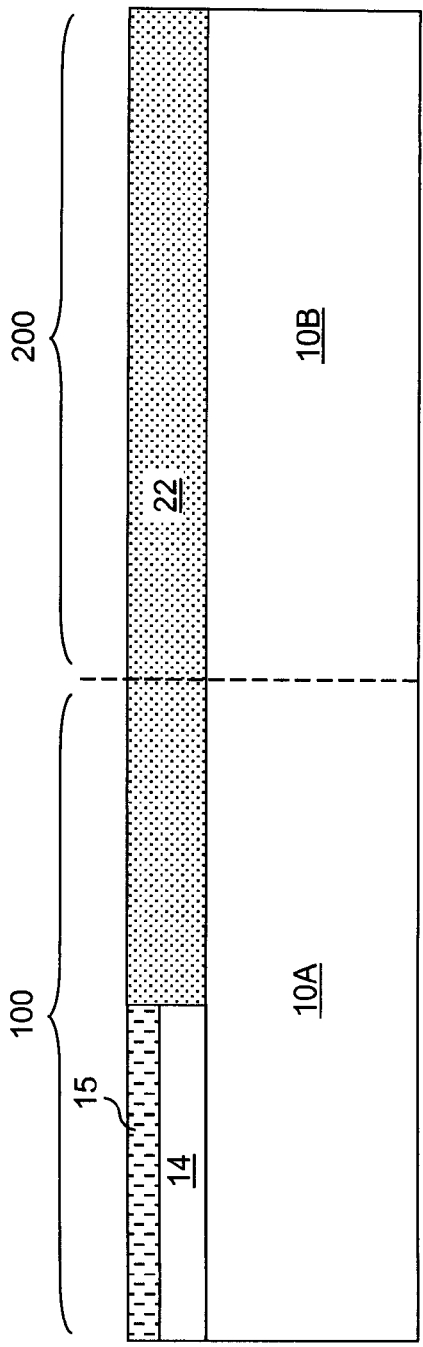
FIG. 3 is a vertical cross-sectional view of the first exemplary semiconductor structure after formation of a surface dielectric layer according to the first embodiment of the present invention.

As stated above, the present invention relates to field effect transistor structures having a partial SiGe channel, and methods of manufacturing the same, which are now described in detail with accompanying figures. It is noted that like and corresponding elements are referred to by like reference numerals.

Referring to FIG. 1, a first exemplary semiconductor structure according to a first embodiment of the present invention includes a semiconductor substrate 8, which includes an underlying silicon layer (10A, 10B) having a semiconductor material. The semiconductor substrate 8 may be a bulk substrate, a semiconductor-on-insulator (SOI) substrate, or a hybrid substrate including a bulk portion and an SOI portion. If the semiconductor substrate 8 is a bulk substrate, the underlying silicon layer (10A, 10B) extends to the entirety of the semiconductor substrate 8. If the semiconductor substrate 8 is an SOI substrate, the semiconductor substrate 8 includes a buried insulator layer (not shown) and a handle substrate (not shown) that are located beneath the underlying silicon layer (10A, 10B). While the present invention is described with an SOI substrate, equivalent embodiments employing other types of substrates are also contemplated herein.

The underlying silicon layer (10A, 10B) is composed of single crystalline silicon. The underlying silicon layer (10A, 10B) includes a first doped silicon portion 10A having a doping of a first conductivity type and a second doped silicon portion 10B having a doping of a second conductivity type. The region of the first semiconductor structure located within or above the first doped silicon portion 10A is herein referred to as a first region 100. The region of the second semiconductor structure located within or above the second doped silicon portion 10B is herein referred to as a second region 200. The second conductivity type is the opposite of the first conductivity type. For example, the first conductivity type can be p-type and the second conductivity type can be n-type, or the first conductivity type can be n-type ad the second conductivity type can be p-type. Typically, the dopant concentration of the first doped silicon portion 10A is from $1.0 \times 10^{14}/cm^3$ to $1.0 \times 10^{18}/cm^3$, and dopant concentration of the first doped silicon portion 10A is from $1.0 \times 10^{14}/cm^3$ to $1.0 \times 10^{18}/cm^3$, although lesser and greater dopant concentrations can also be employed. Preferably, the entirety of the underlying silicon layer (10A, 10B) is single crystalline, i.e., all atoms in the entirety of the underlying silicon layer (10A, 10B) is epitaxially aligned to other atoms in a crystalline lattice.

A dielectric masking layer 22 is formed in the entirety of the second region 200 and a portion of the first region 100 that is contiguous with the second region 100. The dielectric masking layer 22 can be formed by depositing a blanket film of a dielectric masking material, and patterning the dielectric masking material to remove a portion that does not adjoin the second region 200, for example, by lithographic patterning and an etch. After the patterning, an edge of the dielectric masking layer 22 is located within the first region 100. The thickness of the dielectric masking layer 22 can be from 12 nm to 250 nm, and typically from 25 nm to 125 nm, although lesser and greater thicknesses can also be employed. The dielectric masking layer 22 includes a dielectric material such as silicon nitride or silicon oxide. The dielectric masking material of the dielectric masking layer 22 can be deposited, for example, by chemical vapor deposition (CVD). The sub-portion of the first doped silicon portion 10A that underlies the dielectric masking layer 22 is contiguous with the second doped silicon portion 10B. The sub-portion of the first doped silicon portion 10A that does not underlie the dielectric masking layer 22 is laterally spaced from the second doped silicon portion 10B by the sub-portion of the first doped silicon portion 10A that underlies the dielectric masking layer 22.

Referring to FIG. 2, the sub-portion of the first doped silicon portion 10A that is not covered with the dielectric masking layer 22 is herein referred to as a first portion 6A of the underlying silicon layer (10A, 10B). The complementary portion of the first portion 6A of the underlying silicon layer (10A, 10B) is herein referred to as a second portion 6B of the underlying silicon layer (10A, 10B). An epitaxial silicon-germanium layer 14 is formed, by selective epitaxy, on the top surface of the first portion 6A of the underlying silicon layer (10A, 10B), which is the exposed surface of the first doped silicon portion 10A. During the selective epitaxy, a silicon-germanium alloy is deposited epitaxially only on the exposed surface of the first doped silicon portion 10A, while the silicon-germanium alloy is not deposited on the surfaces of the dielectric masking layer 22. Methods of selective epitaxy of a silicon-germanium alloy, i.e., methods of selectively depositing an epitaxial silicon-germanium alloy on exposed surfaces of silicon while preventing deposition of the silicon-germanium alloy on dielectric surfaces are known in the art. Preferably, the thickness of the epitaxial silicon-germanium layer 14 does not exceed the thickness of the dielectric masking layer 22. The thickness of the epitaxial silicon-germanium layer 14 can be from 6 nm to 250 nm, and typically from 12 nm to 125 nm, although lesser and greater thicknesses can also be employed. The atomic percentage of germanium in the epitaxial silicon-germanium layer 14 can be from 1% to 40%, and typically from 2% to 20%, although lesser and greater atomic percentages can also be employed.

Referring to FIG. 3, a top portion of the epitaxial silicon-germanium layer 14 can be converted to a dielectric material portion 15 by thermal conversion or plasma conversion. For example, if the dielectric masking layer 22 is composed of silicon nitride, thermal oxidation or plasma oxidation is employed to convert a top portion of the epitaxial silicon-germanium layer 14 into an oxide of a silicon-germanium alloy, which constitutes the dielectric material portion 15. If the dielectric masking layer 22 is composed of silicon oxide, thermal nitridation or plasma nitridation is employed to convert a top portion of the epitaxial silicon-germanium layer 14 into a nitride of a silicon-germanium alloy, which constitutes the dielectric material portion 15. The thickness of the remaining portion of the epitaxial silicon-germanium layer 14 can be from 5 nm to 200 nm, and typically from (10A, 10B) nm to 100 nm, although lesser and greater thicknesses can also be employed.

Figure 4:
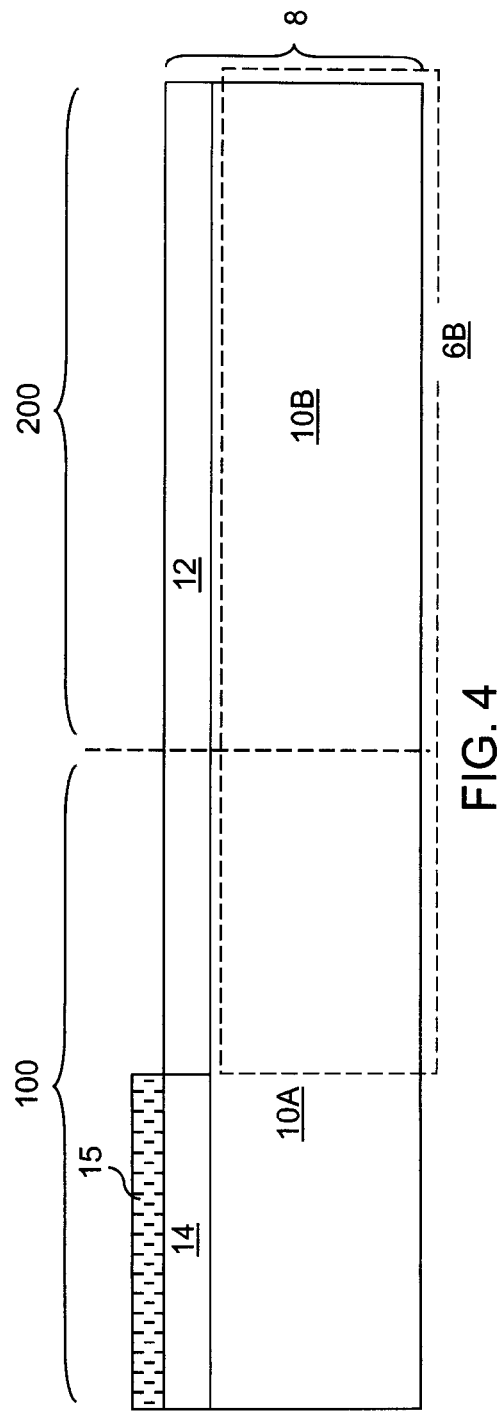
FIG. 4 is a vertical cross-sectional view of the first exemplary semiconductor structure after formation of an epitaxial silicon-germanium layer according to the first embodiment of the present invention.

Referring to FIG. 4, the dielectric masking layer 22 is removed selective to the dielectric material portion 15, the epitaxial silicon-germanium layer 14, and the underlying silicon layer (10A, 10B). The removal of the dielectric masking layer 22 can be effected by employing an etch that selectively removes the dielectric masking layer 22, while not etching or insignificantly etching the dielectric material portion 15. Etchants that provide such selectivity are known in the art.

An epitaxial silicon layer 12 is formed, by selective epitaxy, on the top surface of the second portion 6B of the underlying silicon layer (10A, 10B), which is the exposed portion of the surface of the first doped silicon portion 10A and the exposed surface of the second doped silicon portion 10B. During the selective epitaxy, silicon is deposited epitaxially only on the exposed surface of the second portion 6B of the underlying silicon layer (10A, 10B), while silicon is not deposited on the surfaces of the dielectric material portion 15. Methods of selective epitaxy of silicon, i.e., methods of selectively depositing epitaxial silicon on exposed surfaces of silicon while preventing deposition of silicon on dielectric surfaces are known in the art. Preferably, the thickness of the epitaxial silicon layer 12 is the same as, or is comparable with, the thickness of the epitaxial silicon-germanium layer 14. The thickness of the epitaxial silicon layer 12 can be from 5 nm to 200 nm, and typically from (10A, 10B) nm to 100 nm, although lesser and greater thicknesses can also be employed. The dielectric material portion 15 is subsequently removed selective to the epitaxial silicon layer 12 and the epitaxial silicon-germanium layer 14.

The epitaxial silicon-germanium layer 14 and the epitaxial silicon layer 12 can be formed without doping as intrinsic layers during the epitaxy. In this case, block masks can be employed to dope the epitaxial silicon-germanium layer 14 and the portion of the epitaxial silicon layer 12 in the first region 100 with dopants of the first conductivity type, i.e., with dopants having the same conductivity type as the first doped silicon portion 10A, and to dope the portion of the epitaxial silicon layer 12 in the second region with dopants of the second conductivity type, i.e., with dopants having the same conductivity type as the second doped silicon portion 10B.

Alternately, the epitaxial silicon-germanium layer 14 can be formed with in-situ doping as a doped epitaxial silicon-germanium alloy having a doping of the first conductivity type. In this case, the epitaxial silicon layer 12 can be formed without doping as intrinsic layers during the epitaxy, or can be formed with in-situ doping with dopants of the first conductivity type or the second conductivity type. At least one block mask and at least one ion implantation step can be employed to dope the portion of the epitaxial silicon layer 12 in the first region 100 with dopants of the first conductivity type, and the portion of the epitaxial silicon layer 12 in the second region 200 with dopants of the second conductivity type. After the ion implantation steps, the entirety of the first doped silicon portion 10A, the entirety of the epitaxial silicon-germanium layer 14, and the portion of the epitaxial silicon layer 12 in the first region 100 have a net doping of the first conductivity type, and the entirety of the second doped silicon portion 10B and the portion of the epitaxial silicon layer 12 in the second region 200 have a net doping of the second conductivity type. The entirety of the semiconductor substrate 8, which includes first doped silicon portion 10A, the second doped silicon portion 10B, the epitaxial silicon-germanium layer 14, and the epitaxial silicon layer 12, is single crystalline, i.e., epitaxially aligned. If the thickness of the epitaxial silicon-germanium layer 14 is different from the thickness of the epitaxial silicon layer 12, the top surface of the semiconductor substrate 8 can be planarized so that the top surfaces of the epitaxial silicon-germanium layer 14 and the epitaxial silicon layer 12 are coplanar, i.e., located in the same horizontal plane.

Figure 5:
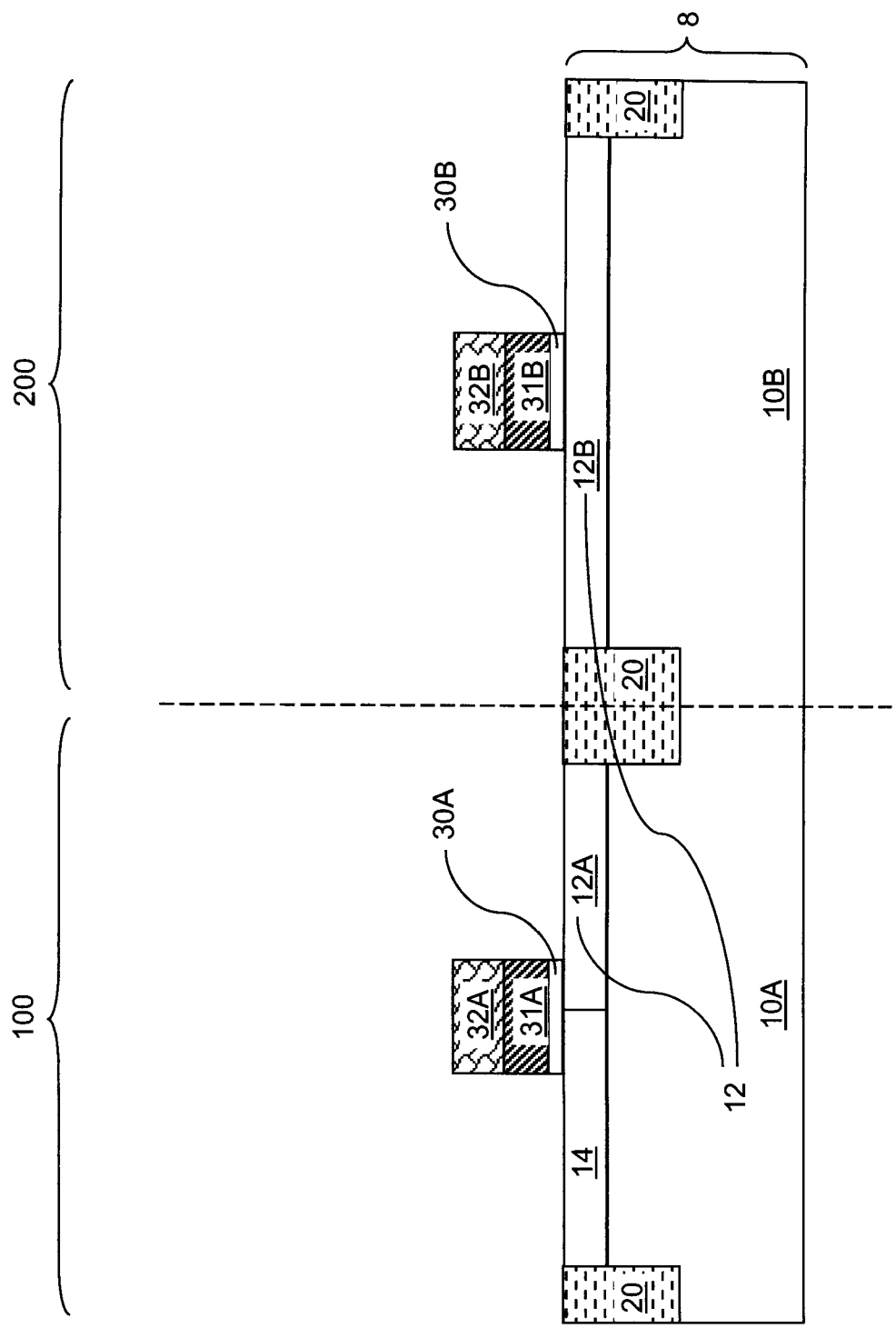
FIG. 5 is a vertical cross-sectional view of the first exemplary semiconductor structure after formation of gate stacks according to the first embodiment of the present invention.

Referring to FIG. 5, isolation structures 20 are formed in the semiconductor substrate 8. The isolation structures (10A, 10B) include a dielectric material such as silicon oxide and/or silicon nitride. For example, the isolation structures (10A, 10B) can be shallow trench isolation structures known in the art. Typically, the isolation structures 20 extend to a depth that exceeds the thickness of the epitaxial silicon-germanium layer 14 and the epitaxial silicon layer 12. The portion of the epitaxial silicon layer 12 in the first region 100 is herein referred to as a first epitaxial silicon layer 12A, and the portion of the epitaxial silicon layer 12 in the second region 200 is herein referred to as a second epitaxial silicon layer 12B. The first epitaxial silicon layer 12A and the second epitaxial silicon layer 12B can be laterally spaced by one of the isolation structures 20.

Gate stacks are formed by depositing and lithographically patterning a stack of a blanket dielectric layer and at least one blanket conductive material layer. For example, a stack of a gate dielectric layer, a metal gate layer, and a semiconductor gate layer can be deposited and lithographically patterned to form a first gate stack in the first region 100 and a second gate stack in the second region 200. The first gate stack includes a first gate dielectric 30A and at least one of a first gate metal portion 31A and a first gate semiconductor portion 32A. The second gate stack includes a second gate dielectric 30B and at least one of a second gate metal portion 31B and a second gate semiconductor portion 32B. The first gate stack (30A, 31A, 32A) overlies the interface between the first epitaxial silicon layer 12A and the epitaxial silicon-germanium layer 14. Thus, the first gate dielectric 30A straddles over the boundary between the epitaxial silicon-germanium layer 14 and the first epitaxial silicon layer 12A. In one embodiment, the lateral distance between one edge of the first gate dielectric 30A and the interface between the first epitaxial silicon layer 12A and the epitaxial silicon-germanium layer 14 is from 20% to 80% of the gate length, i.e., the distance between two opposite sidewalls of the first gate dielectric 30A.

In one embodiment, the first and second gate dielectrics (30A, 30B) can be composed of a high dielectric constant (high-k) dielectric material including a dielectric metal oxide and having a dielectric constant greater than 4.0. The dielectric metal oxide is a high-k material including a metal and oxygen, and optionally nitrogen. For example, the high-k dielectric material may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2

The high-k dielectric material may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. The thickness of the first and second gate dielectrics (30A, 30B) in this embodiment can be from about 2 nm to about 6 nm, and may have an effective oxide thickness on the order of or less than 1 nm, although lesser and greater thicknesses can also be employed.

In another embodiment, the first and second gate dielectrics (30A, 30B) can be composed of a dielectric material derived from conversion of surface portions of the first epitaxial silicon layer 12A, the epitaxial silicon-germanium layer 14, and the second epitaxial silicon layer 12B by oxidation, nitridation, or a combination thereof. For example, the first gate dielectric 30A can be a combination of silicon oxide and a silicon-germanium oxide, a combination of silicon nitride and a silicon-germanium nitride, a combination of silicon oxynitride and a silicon-germanium oxynitride, or a vertical stack thereof. The second gate dielectric 30B can be silicon oxide, silicon nitride, silicon oxynitride, or a vertical stack thereof. The thicknesses of the first and second gate dielectrics (30A, 30B) in this embodiment can be from about 1 nm to about 6 nm, although lesser and greater thicknesses can also be employed.

The first and second gate stacks can include the first and second metal gate portions (31A, 31B), respectively. For example, the first and second metal gate portions (31A, 31B) can be formed directly on a high dielectric constant (high-k) dielectric material of the first and second gate dielectrics (30A, 30B), which can be effected by chemical vapor deposition (CVD), physical vapor deposition (PVD), atomic layer deposition (ALD), etc. The first and second metal gate portions (31A, 31B) comprise a conductive metallic material which may be a metal, a metal alloy, or a metallic nitride. For example, the first and second metal gate portions (31A, 31B) may comprise a material such as TaN, TiN, WN, TiAlN, TaCN, other conductive refractory metallic nitrides, or an alloy thereof. The conductive metallic material is also known as metal gate material in the art. The thickness of the first and second metal gate portions (31A, 31B) may be from about 5 nm to about 40 nm, and preferably from about 7 nm to about 20 nm, although lesser and greater thicknesses are also contemplated herein. The composition of the first and second metal gate portions (31A, 31B) may be selected to optimize performance of semiconductor devices such as a threshold voltage of a transistor employing a metal gate. The thickness of the first and second metal gate portions (31A, 31B), if present, can be from 1 nm to 150 nm, and typically from 5 nm to 100 nm, although lesser and greater thicknesses can also be employed.

The first and second gate stacks can include the first and second semiconductor gate portions (32A, 32B), respectively. The first and second semiconductor gate portions (32A, 32B) can include a polycrystalline semiconductor material having a p-type doping or an n-type doping. The thickness of the first and second metal gate portions (31A, 31B), if present, can be from 30 nm to 200 nm, and typically from 50 nm to 120 nm, although lesser and greater thicknesses can also be employed.

Figure 6:
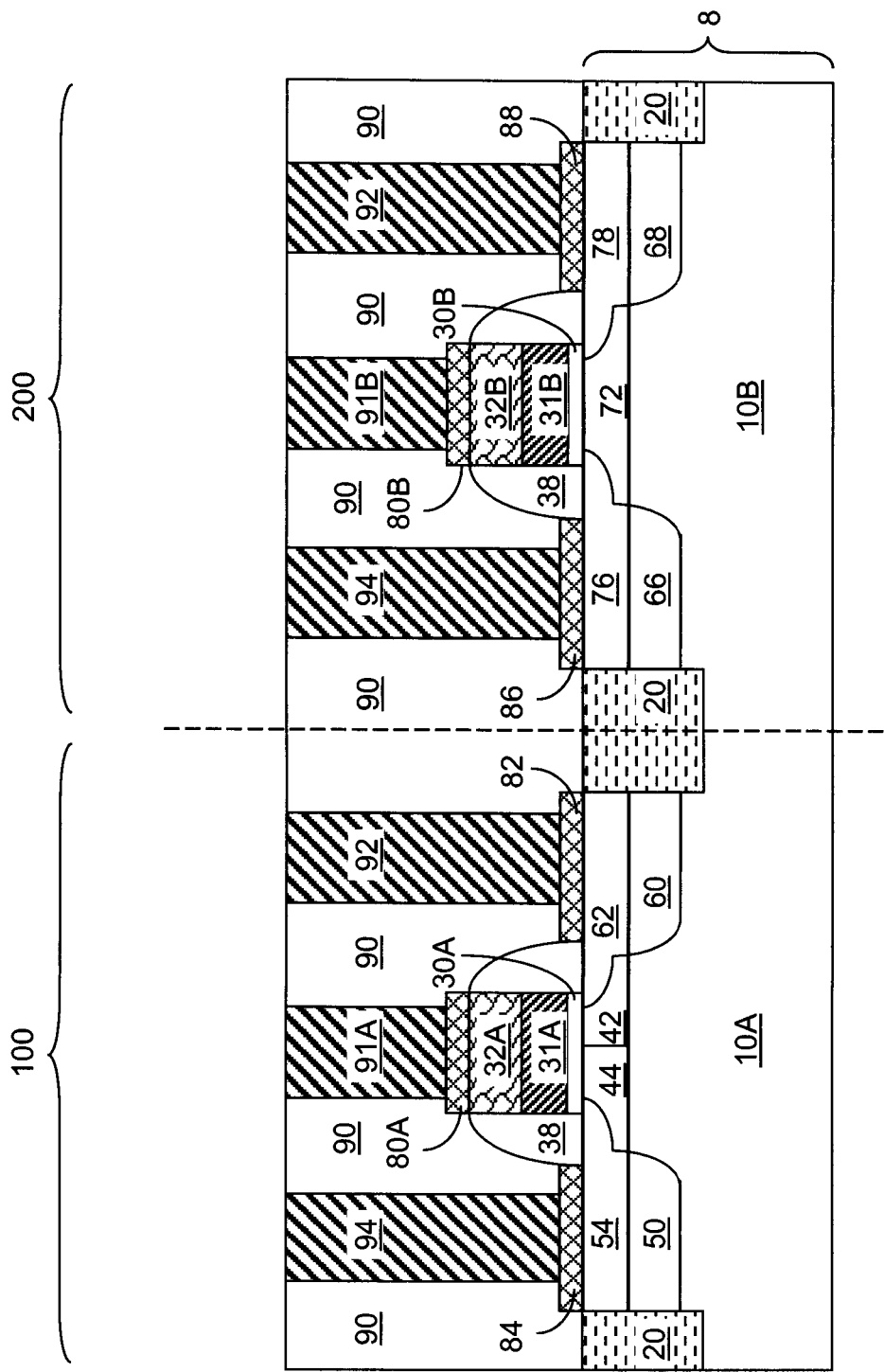
FIG. 6 is a vertical cross-sectional view of the first exemplary semiconductor structure after formation of field effect transistors according to the first embodiment of the present invention.

Referring to FIG. 6, masked source and drain extension ion implantation is performed to form source and drain extension regions, followed by formation of dielectric gate spacers 38 on sidewalls of the first gate stack (30A, 31A, 32A) and the second gate stack (30B, 31B, 32B) employing methods known in the art. Subsequently, masked deep source and drain ion implantation is performed to implant dopants into the semiconductor substrate 8 such that source and drain regions self-aligned to the first gate stack (30A, 31A, 32A) and the second gate stack (30B, 31B, 32B) are formed within the semiconductor substrate 8. Multiple implantation masks are employed to implant each type of dopant into target areas, while protecting the remaining areas from unwanted implantation of dopants.

Specifically, dopants of the second conductivity type are implanted into the first region 100 during the masked source and drain extension ion implantation and the masked deep source and drain ion implantation to form a first source region and a first drain region. The first source region includes a doped SiGe source portion 54 and a doped Si source portion 50. The doped Si source portion 50 contacts a bottom surface of the doped SiGe source portion 54, which includes a source extension region that laterally protrudes and contacts a bottom surface of a peripheral portion of the first gate dielectric 30A. The doped SiGe source portion 54 is a doped portion of the epitaxial silicon-germanium layer 14, which is formed by implanting dopants of the second conductivity type during the masked source and drain extension ion implantation and the masked deep source and drain ion implantation. The doped Si source portion 50 is a portion of the first doped silicon portion 10A that is implanted with dopants of the second conductivity type during the masked deep source and drain ion implantation.

The first drain region includes a first epitaxial-Si drain portion 62 and a first buried Si drain portion 60. The first buried Si drain portion 60 contacts a bottom surface of the first epitaxial-Si drain portion 62, which includes a drain extension region that laterally protrudes and contacts a bottom surface of another peripheral portion of the first gate dielectric 30A. The first epitaxial-Si drain portion 62 is a doped portion of the first epitaxial silicon layer 12A, and is formed by implanting dopants of the second conductivity type during the masked source and drain extension ion implantation and the masked deep source and drain ion implantation. The first buried Si drain portion 60 is a portion of the first doped silicon portion 10A that is implanted with dopants of the second conductivity type during the masked deep source and drain ion implantation.

The portions of the first doped silicon portion 10A, the epitaxial silicon-germanium layer 14, and the first epitaxial silicon layer 12A that are not implanted with dopants during the masked source and drain extension ion implantation and the masked deep source and drain ion implantation collectively constitute a first body region of a first field effect transistor. The first body region includes a SiGe body portion 44, a first Si body portion 42, and a first underlying Si body portion which is the remaining portion of the first doped silicon portion 10A. The SiGe body portion 44A laterally contacts the doped SiGe source portion 54. The first Si body portion 42 laterally contacts the first epitaxial-Si drain portion 62. The first underlying Si body portion 10A contacts the doped Si source portion 50 and the first buried Si drain portion 60. The SiGe body portion 44 and the first Si body portion 42 contact each other and a bottom surface of the first gate dielectric 30A of the first field effect transistor.

The entirety of the first body region (10A, 44, 42) has a doping of the first conductivity type, the entirety of the first source region (54, 52) has a doping of the second conductivity type, and the entirety of the first drain region (62, 60) has a doping of the second conductivity type. The entirety of the first source region (52, 54), the entirety of the first drain region (62, 60), and the entirety of the first body region (10A, 44, 42) are single crystalline and epitaxially aligned to one another. The bottom surface of the doped SiGe source portion 54, the bottom surface of the SiGe body portion 44, and the bottom surface of the first Si body portion 42 are located on the same horizontal plane.

A second field effect transistor can be formed in the second region 200. Specifically, dopants of the first conductivity type are implanted into the second region 200 during the masked source and drain extension ion implantation and the masked deep source and drain ion implantation to form a second source region and a second drain region. The second source region includes a doped epitaxial-Si source portion 76 and a buried Si source portion 66. The buried Si source portion 66 contacts a bottom surface of the doped epitaxial-Si source portion 76, which includes a source extension region that laterally protrudes and contacts a bottom surface of a peripheral portion of the second gate dielectric 30B. The doped epitaxial-Si source portion 76 is a doped portion of the second epitaxial silicon layer 12B. The doped epitaxial-Si source portion 76 can be formed by implanting dopants of the first conductivity type during the masked source and drain extension ion implantation and the masked deep source and drain ion implantation. The buried Si source portion 66 is a portion of the second doped silicon portion 10B that is implanted with dopants of the first conductivity type during the masked deep source and drain ion implantation.

The second drain region includes a second doped epitaxial-Si drain portion 78 and a second buried doped Si drain portion 68. The second buried doped Si drain portion 68 contacts a bottom surface of the second doped epitaxial-Si drain portion 78, which includes the drain extension region that laterally protrudes and contacts a bottom surface of another peripheral portion of the second gate dielectric 30B. The second doped epitaxial-Si drain portion 78 is a doped portion of the second epitaxial silicon layer 12B, and is formed by implanting dopants of the first conductivity type during the masked source and drain extension ion implantation and the masked deep source and drain ion implantation. The second buried doped Si drain portion 68 is a portion of the second doped silicon portion 10B that is implanted with dopants of the first conductivity type during the masked deep source and drain ion implantation.

The portions of the second doped silicon portion 10B and the second epitaxial silicon layer 12B that are not implanted with dopants during the masked source and drain extension ion implantation and the masked deep source and drain ion implantation collectively constitute a second body region of a second field effect transistor. The second body region includes a second Si body portion 72 and a second underlying Si body portion which is the remaining portion of the second doped silicon portion 10B. The second Si body portion 72 laterally contacts the doped epitaxial-Si source portion 76 and the second doped epitaxial-Si drain portion 78. The second underlying Si body portion 10B contacts the buried Si source portion 66 and the second buried doped Si drain portion 68. The second Si body portion 72 contact a bottom surface of the second gate dielectric 30B of the first field effect transistor.

The entirety of the second body region (10B, 72) has a doping of the second conductivity type, the entirety of the second source region (66, 76) has a doping of the first conductivity type, and the entirety of the second drain region (68, 78) has a doping of the first conductivity type. The entirety of the second source region (66, 76), the entirety of the second drain region (68, 78), and the entirety of the second body region (10B, 72) are single crystalline and epitaxially aligned to one another.

Metal semiconductor alloys can be formed on exposed semiconductor surfaces, for example, by depositing a metal layer and inducing a reacting between the metal layer and the underlying semiconductor material. For example, a first source-side metal semiconductor alloy portion 84 can be formed directly on the doped SiGe source portion 54, a first drain-side metal semiconductor alloy portion 82 can be formed directly on the first epitaxial-Si drain portion 62, and a first gate-side metal semiconductor alloy portion 80A can be formed directly on the first gate semiconductor portion 32A. Likewise, a second source-side metal semiconductor alloy portion 86 can be formed directly on the doped epitaxial-Si source portion 76, a second drain-side metal semiconductor alloy portion 88 can be formed directly on the second doped epitaxial-Si drain portion 78, and a second gate-side metal semiconductor alloy portion 80B can be formed directly on the second gate semiconductor portion 32B. The first source-side metal semiconductor alloy portion 84 is a germanosilicide of a metal, while the first drain-side metal semiconductor alloy portion 82, the second source-side metal semiconductor alloy portion 86, and second drain-side metal semiconductor alloy portion 88 are silicide of a metal and do not include germanium.

A dielectric material layer 90 is deposited over the semiconductor substrate 8, the various metal semiconductor alloy portions (84, 82, 80A, 86, 88, 80B), and the dielectric gate spacers 38. The dielectric material layer 90 includes a dielectric material such as undoped silicate glass, doped silicate glass, organosilicate glass (OSG), or a porous dielectric material. In one embodiment, the dielectric material layer 90 can include a porous or non-porous low dielectric constant (low-k) material having a dielectric constant less than 2.7.

Via cavities are formed within the dielectric material layer 90, and are subsequently filled with a conductive material to form various contact structures. In one embodiment, the conductive material is a metallic material such as W, Al, Cu, Al, TaN, TiN, WN, or a combination thereof. In another embodiment, the conductive material is a doped semiconductor material such as doped polysilicon or a doped silicon-containing semiconductor material. The conductive material can be deposited, for example, by chemical vapor deposition (CVD), physical vapor deposition (PVD), electroplating, electroless plating, or a combination thereof. Excess conductive material above the top surface of the dielectric material layer 90 can be removed, for example, by planarization. The various contact structures can include, for example, a first source-side contact structure 94, a first drain-side contact structure 92, a first gate-side contact structure 91A, a second source-side contact structure 94, a second drain-side contact structure 92, and a second gate-side contact structure 91B.

Referring to FIG. 7, a variation of the first exemplary semiconductor structure includes a semiconductor substrate 8 as in FIG. 1. A dielectric masking layer 22 is formed in the area of a first portion 6A of the underlying silicon layer (10A, 10B). The first portion 6A is a sub-portion of the first doped silicon portion 10A that is covered with the dielectric masking layer 22. The complementary portion of the first portion 6A of the underlying silicon layer (10A, 10B) is herein referred to as a second portion 6B of the underlying silicon layer (10A, 10B). The dielectric masking layer 22 can have the same composition and thickness as described above.

Referring to FIG. 8, an epitaxial silicon layer 12 is formed, by selective epitaxy, on the top surface of the second portion 6B of the underlying silicon layer (10A, 10B), which is the exposed portion of the surface of the first doped silicon portion 10A and the exposed surface of the second doped silicon portion 10B. The same methods of selective epitaxy of silicon as described above can be employed. The thickness of the epitaxial silicon layer 12 can be from 6 nm to 250 nm, and typically from 12 nm to 125 nm, although lesser and greater thicknesses can also be employed.

Referring to FIG. 9, a top portion of the epitaxial silicon layer 12 can be converted to a dielectric material portion 15 by thermal conversion or plasma conversion. For example, if the dielectric masking layer 22 is composed of silicon nitride, thermal oxidation or plasma oxidation is employed to convert a top portion of the epitaxial silicon layer 12 into silicon oxide, which constitutes the dielectric material portion 15. If the dielectric masking layer 22 is composed of silicon oxide, thermal nitridation or plasma nitridation is employed to convert a top portion of the epitaxial silicon layer 12 into silicon nitride, which constitutes the dielectric material portion 15. The thickness of the remaining portion of the epitaxial silicon layer 12 can be from 5 nm to 200 nm, and typically from (10A, 10B) nm to 100 nm, although lesser and greater thicknesses can also be employed.

Referring to FIG. 10, the dielectric masking layer 22 is removed selective to the dielectric material portion 15, the epitaxial silicon layer 12, and the underlying silicon layer (10A, 10B). The removal of the dielectric masking layer 22 can be effected by employing an etch that selectively removes the dielectric masking layer 22, while not etching or insignificantly etching the dielectric material portion 15. Etchants that provide such selectivity are known in the art.

An epitaxial silicon-germanium layer 14 is formed, by selective epitaxy, on the top surface of the first portion 6A of the underlying silicon layer (10A, 10B), which is the exposed surface of the first doped silicon portion 10A. During the selective epitaxy, a silicon-germanium alloy is deposited epitaxially only on the exposed surface of the first doped silicon portion 10A, while the silicon-germanium alloy is not deposited on the surfaces of the dielectric material portion 15. The selective epitaxy of a silicon-germanium alloy can be effected employing the same methods as described above. The thickness of the epitaxial silicon-germanium layer 14 can be from 5 nm to 200 nm, and typically from (10A, 10B) nm to 100 nm, although lesser and greater thicknesses can also be employed. The atomic percentage of germanium in the epitaxial silicon-germanium layer 14 can be from 1% to 40%, and typically from 2% to 20%, although lesser and greater atomic percentages can also be employed. The dielectric material portion 15 is subsequently removed selective to the epitaxial silicon layer 12 and the epitaxial silicon-germanium layer 14.

After optional ion implantation steps that cover one of the first doped silicon portion 10A and the second doped silicon portion 10B, the entirety of the first doped silicon portion 10A, the entirety of the epitaxial silicon-germanium layer 14, and the portion of the epitaxial silicon layer 12 in the first region 100 have a net doping of the first conductivity type, and the entirety of the second doped silicon portion 10B and the portion of the epitaxial silicon layer 12 in the second region 200 have a net doping of the second conductivity type as described above. The entirety of the semiconductor substrate 8, which includes first doped silicon portion 10A, the second doped silicon portion 10B, the epitaxial silicon-germanium layer 14, and the epitaxial silicon layer 12, is single crystalline, i.e., epitaxially aligned. If the thickness of the epitaxial silicon-germanium layer 14 is different from the thickness of the epitaxial silicon layer 12, the top surface of the semiconductor substrate 8 can be planarized so that the top surfaces of the epitaxial silicon-germanium layer 14 and the epitaxial silicon layer 12 are coplanar, i.e., located in the same horizontal plane. The same processing steps of FIGS. 5 and 6 can be subsequently performed to form the first semiconductor structure shown in FIG. 6.

Figure 11:
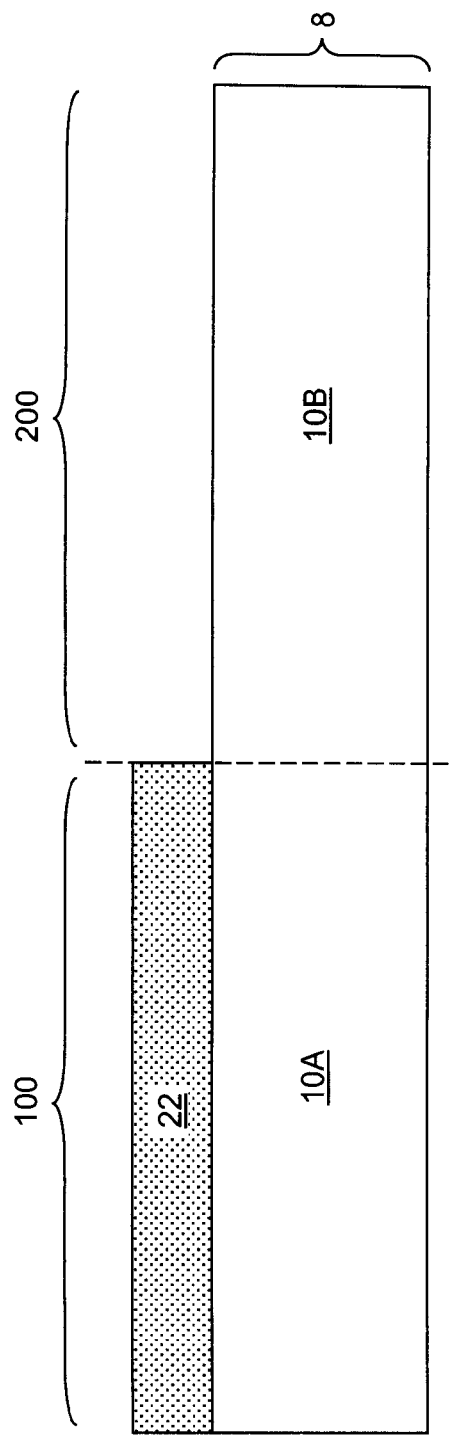
FIG. 11 is a vertical cross-sectional view of a second exemplary semiconductor structure after formation of a dielectric masking layer according to a second embodiment of the present invention.

Referring to FIG. 11, a second exemplary semiconductor structure according to a second embodiment of the present invention includes a semiconductor substrate 8, which can be the same as the semiconductor substrate 8 in FIG. 1 of the first embodiment. In the second exemplary semiconductor structure, a dielectric masking layer 22 is formed in the area of the first doped silicon portion 10A of the underlying silicon layer (10A, 10B), while the area of the second doped silicon portion 10B of the underlying silicon layer (10A, 10B) is not covered by the dielectric masking layer 22. The second exemplary semiconductor structure can be derived from the variation of the first exemplary semiconductor structure in FIG. 7 by changing the area covered by the dielectric masking layer 22 so that the edge of the dielectric masking layer 22 coincides with the boundary between the first doped silicon portion 10A and the second doped silicon portion 10B. The dielectric masking layer 22 can have the same composition and thickness as described above.

Figure 12:
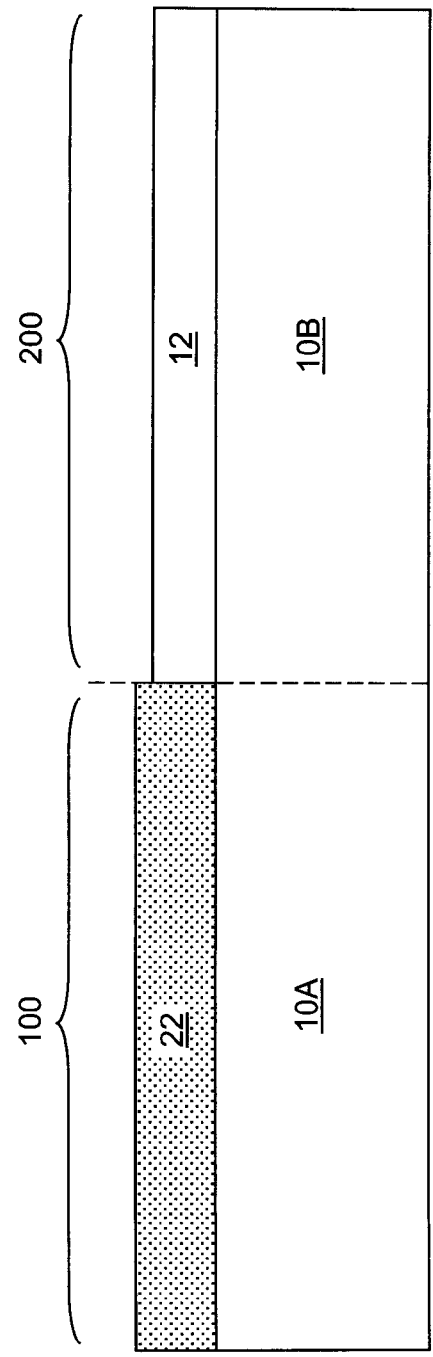
FIG. 12 is a vertical cross-sectional view of the second exemplary semiconductor structure after formation of a first epitaxial silicon layer according to the second embodiment of the present invention.

Referring to FIG. 12, an epitaxial silicon layer 12 is formed, by selective epitaxy, on the top surface of the second doped silicon portion 10B. The same methods of selective epitaxy of silicon as described above can be employed. The thickness of the epitaxial silicon layer 12 can be from 6 nm to 250 nm, and typically from 12 nm to 125 nm, although lesser and greater thicknesses can also be employed.

Referring to FIG. 13, a top portion of the epitaxial silicon layer 12 can be converted to a dielectric material portion 15 by thermal conversion or plasma conversion employing the same methods as described above at a processing step corresponding to FIG. 9. The thickness of the remaining portion of the epitaxial silicon layer 12 can be from 5 nm to 200 nm, and typically from (10A, 10B) nm to 100 nm, although lesser and greater thicknesses can also be employed.

Referring to FIG. 14, the dielectric masking layer 22 is removed selective to the dielectric material portion 15, the epitaxial silicon layer 12, and the underlying silicon layer (10A, 10B). The removal of the dielectric masking layer 22 can be effected by employing an etch that selectively removes the dielectric masking layer 22, while not etching or insignificantly etching the dielectric material portion 15. Etchants that provide such selectivity are known in the art.

An epitaxial silicon-germanium layer 14 is formed, by selective epitaxy, on the top surface of the first doped silicon portion 10A. During the selective epitaxy, a silicon-germanium alloy is deposited epitaxially only on the exposed surface of the first doped silicon portion 10A, while the silicon-germanium alloy is not deposited on the surfaces of the dielectric material portion 15. The selective epitaxy of a silicon-germanium alloy can be effected employing the same methods as described above. The thickness of the epitaxial silicon-germanium layer 14 can be from 3 nm to 150 nm, and typically from 5 nm to 80 nm, although lesser and greater thicknesses can also be employed. The atomic percentage of germanium in the epitaxial silicon-germanium layer 14 can be from 1% to 40%, and typically from 2% to 20%, although lesser and greater atomic percentages can also be employed.

Another epitaxial silicon layer is formed, by selective epitaxy, on the top surface of the epitaxial silicon-germanium layer 14. Silicon is deposited on the exposed surface of the epitaxial silicon-germanium layer 14, while silicon is not deposited on the surfaces of the dielectric material portion 15. The epitaxial silicon layer formed on the top surface of the epitaxial silicon-germanium layer 14 is a surface silicon layer, i.e., a silicon layer having a surface that is a surface of the semiconductor substrate 8. To distinguish the epitaxial silicon layer formed on the top surface of the epitaxial silicon-germanium layer 14 from the epitaxial layer located directly on the second doped silicon portion 10B, the epitaxial silicon layer 12 formed on the top surface of the epitaxial silicon-germanium layer 14 is herein referred to as a first epitaxial silicon layer 16, and the epitaxial layer 12 located directly on the second doped silicon portion 10B is herein referred to as a second epitaxial silicon layer 12'. The thickness of the first epitaxial silicon layer 16 can be from 3 nm to 150 nm, and typically from 5 nm to 80 nm, although lesser and greater thicknesses can also be employed. The dielectric material portion 15 is subsequently removed selective to the first epitaxial silicon layer 16 and the second epitaxial silicon layer 12'.

The second epitaxial silicon layer 12' can be deposited as an intrinsic silicon layer or with in-situ doping of the second conductivity type. The epitaxial silicon-germanium layer 14 can be deposited as an intrinsic silicon-germanium alloy layer or with in-situ doping of the first conductivity type. The first epitaxial silicon layer 16 can be deposited as an intrinsic silicon layer or with in-situ doping of the first conductivity type. If any of the second epitaxial silicon layer 12', the epitaxial silicon-germanium layer 14, and the first epitaxial silicon layer 16 is deposited as an intrinsic layer, optional ion implantation step(s) can be employed so that the entirety of the semiconductor material in the first region has a net doping of the first conductivity type, and the entirety of the semiconductor material in the second region 200 has a net doping of the second conductivity type. The entirety of the semiconductor substrate 8, which includes first doped silicon portion 10A, the second doped silicon portion 10B, the epitaxial silicon-germanium layer 14, the first epitaxial silicon layer 16, and the second epitaxial silicon layer 12', is single crystalline, i.e., epitaxially aligned. If the thickness of the stack of the epitaxial silicon-germanium layer 14 and the first epitaxial silicon layer 16 is different from the thickness of the second epitaxial silicon layer 12', the top surface of the semiconductor substrate 8 can be planarized so that the top surfaces of the first epitaxial silicon layer 16 and the second epitaxial silicon layer 12' are coplanar, i.e., located in the same horizontal plane.

Figure 15:
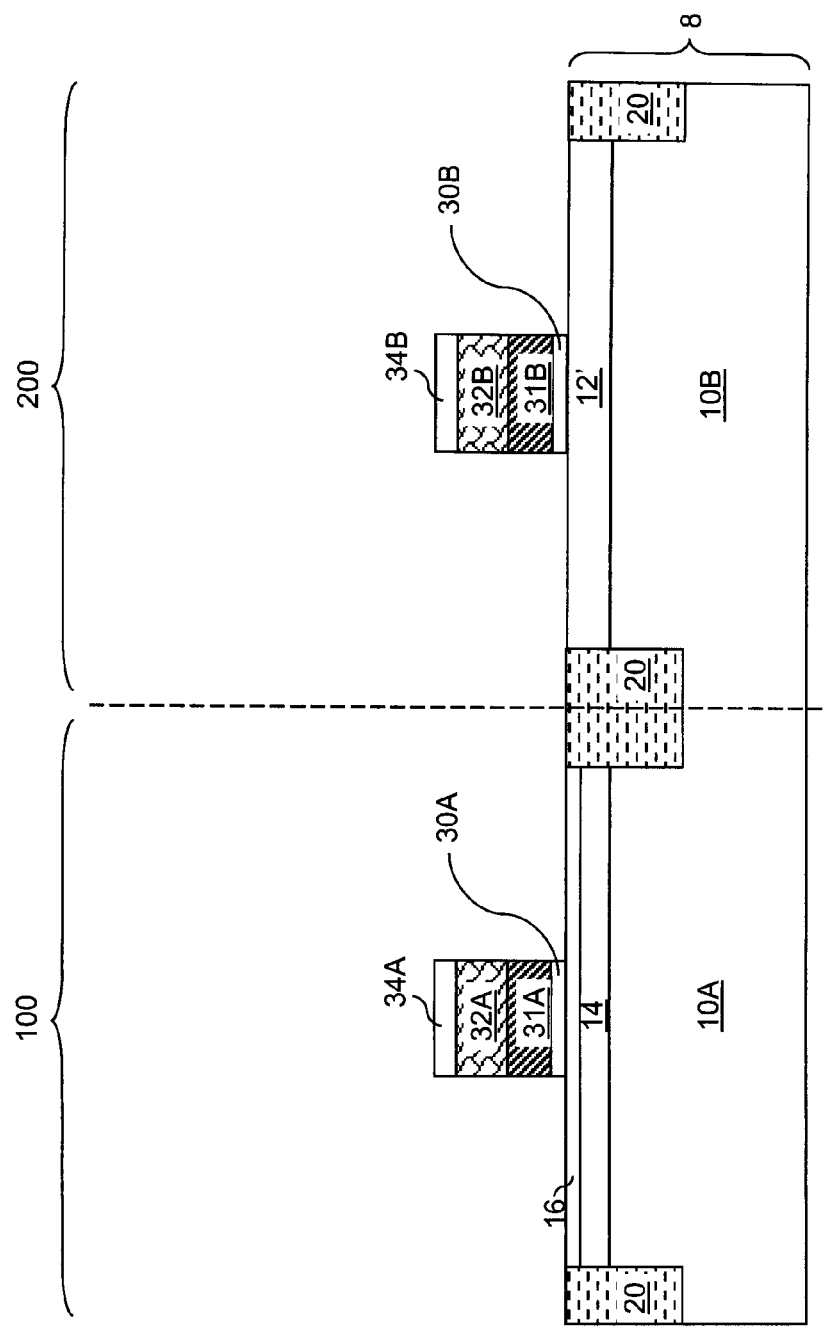
FIG. 15 is a vertical cross-sectional view of the second exemplary semiconductor structure after formation of gate stacks according to the second embodiment of the present invention.

Referring to FIG. 15, the processing steps of FIG. 5 of the first embodiment are employed to form isolation structures 20, a first gate stack located in the first region 100, and a second gate stack located in the second region 200. The first gate stack includes, from bottom to top, a first gate dielectric 30A, a first gate metal portion 31A, a first gate semiconductor portion 32A, and a first dielectric gate cap 34A. The second gate stack includes, from bottom to top, a second gate dielectric 30B, a second gate metal portion 31B, a second gate semiconductor portion 32B, and a second dielectric gate cap 34B. The first gate stack (30A, 31A, 32A, 34A) and the second gate stack (30B, 31B, 32B, 34B) can be formed by employing the same methods as in the first embodiment with the modification of adding a dielectric gate cap layer prior to lithographically patterning the material stack above the top surface of the semiconductor substrate. The dielectric gate cap layer includes a dielectric material such as silicon oxide, silicon nitride, or silicon oxynitride, and has a thickness from 20 nm to 60 nm, although lesser and greater thicknesses can also be employed. The remaining portions of the dielectric gate cap layer after patterning constitute the first dielectric gate cap 34A and the second dielectric gate cap 34B.

Figure 16:
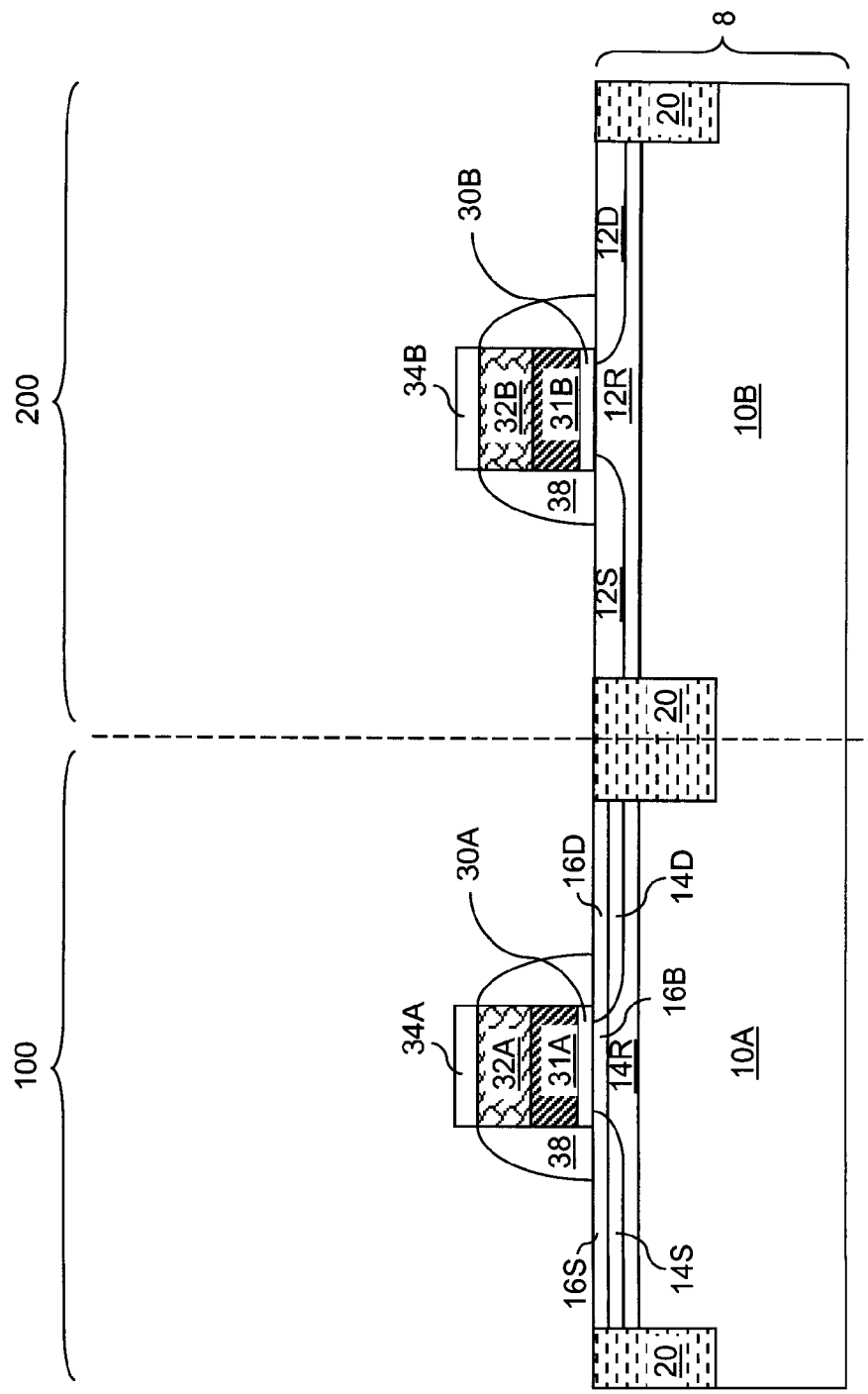
FIG. 16 is a vertical cross-sectional view of the second exemplary semiconductor structure after formation of source and drain extension regions and dielectric gate spacers according to the second embodiment of the present invention.

Referring to FIG. 16, masked source and drain extension ion implantation is performed to form source and drain extension regions. Specifically, dopants of the second conductivity type are implanted into the first region 100 to form a first doped epitaxial-Si source portion 16S in a portion of the first epitaxial silicon layer 16, an intermediate doped SiGe source portion 14S in a portion of the epitaxial silicon-germanium layer 14, an extension-side epitaxial-Si drain portion 16D in another portion of the first epitaxial silicon layer 16, and an intermediate doped SiGe drain portion 14D in another portion of the epitaxial silicon-germanium layer 14. The portion of the first epitaxial silicon layer 16 that is not implanted during the masked source and drain extension ion implantation constitute an upper Si body portion 16B. The portion of the epitaxial silicon-germanium layer 14 that is not implanted during the masked source and drain extension ion implantation is herein referred to as a remainder epitaxial silicon-germanium portion 14R.

Dopants of the first conductivity type are implanted into the second region 200 to form a second doped epitaxial-Si source portion 12S in a portion of the second epitaxial silicon layer 12 and a second doped epitaxial-Si drain region 12D in another portion of the second epitaxial silicon layer 12 The portion of the second epitaxial silicon layer 12B that is not implanted during the masked source and drain extension ion implantation is herein referred to as a remainder epitaxial silicon portion 12R.

Figure 17:
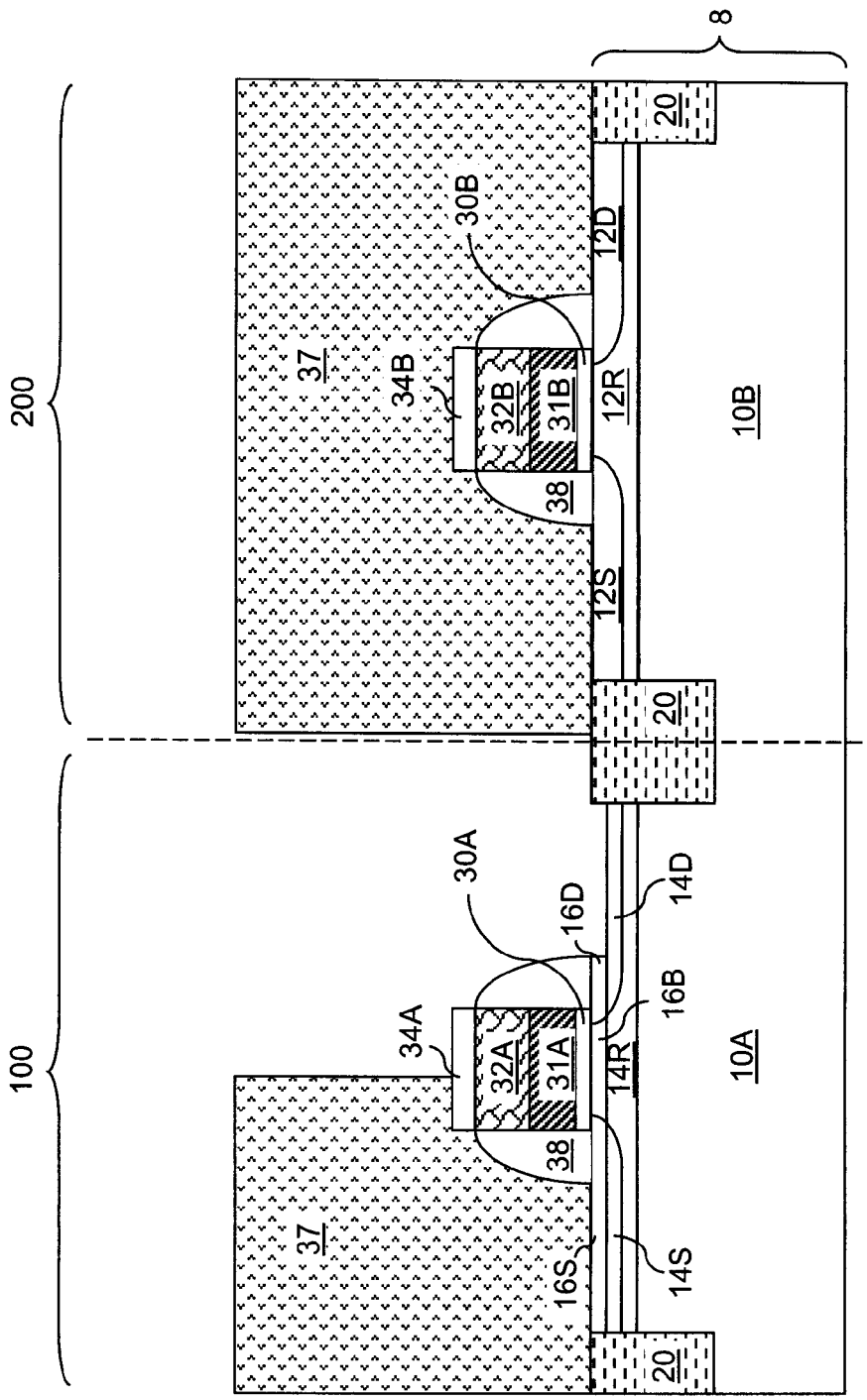
FIG. 17 is a vertical cross-sectional view of the second exemplary semiconductor structure after formation and patterning of a masking layer and removal of an exposed portion of the second epitaxial silicon layer according to the second embodiment of the present invention.

Referring to FIG. 17, a masking layer 37 is formed over the semiconductor substrate 8, the first and second gate stacks (30A, 31A, 32A, 34A, 30B, 31B, 32B, 34B) and the dielectric gate spacers 38, and is lithographically patterned to form an opening therein. The masking layer 37 can be a photoresist layer. The opening in the masking layer 37 is formed in an area including all of the top surface of the extension-side epitaxial-Si drain portion 16D and one side of the dielectric gate spacer 38 in the first region 100. An edge of the masking layer 37 can be located over the first gate stack (30A, 31A, 32A, 34A) and another edge of the masking layer 37 can be located on a top surface of an isolation structure 20 adjacent to the doped epitaxial-Si drain portion 16D.

Employing the dielectric gate spacer 38 in the first region 100 and the masking layer 37 as an etch mask, the silicon material in the extension-side epitaxial-Si drain portion 16D is removed by an etch. The etch can be an isotropic etch such as a wet etch or an anisotropic etch such as a reactive ion etch. A top surface of the intermediate doped SiGe drain portion 14D is exposed. In case the etch is an anisotropic etch, a sidewall of the remaining portion of the extension-side epitaxial-Si drain portion 16D is vertically coincident with an outer sidewall of the dielectric gate spacer 38 in the first region 100.

Figure 18:
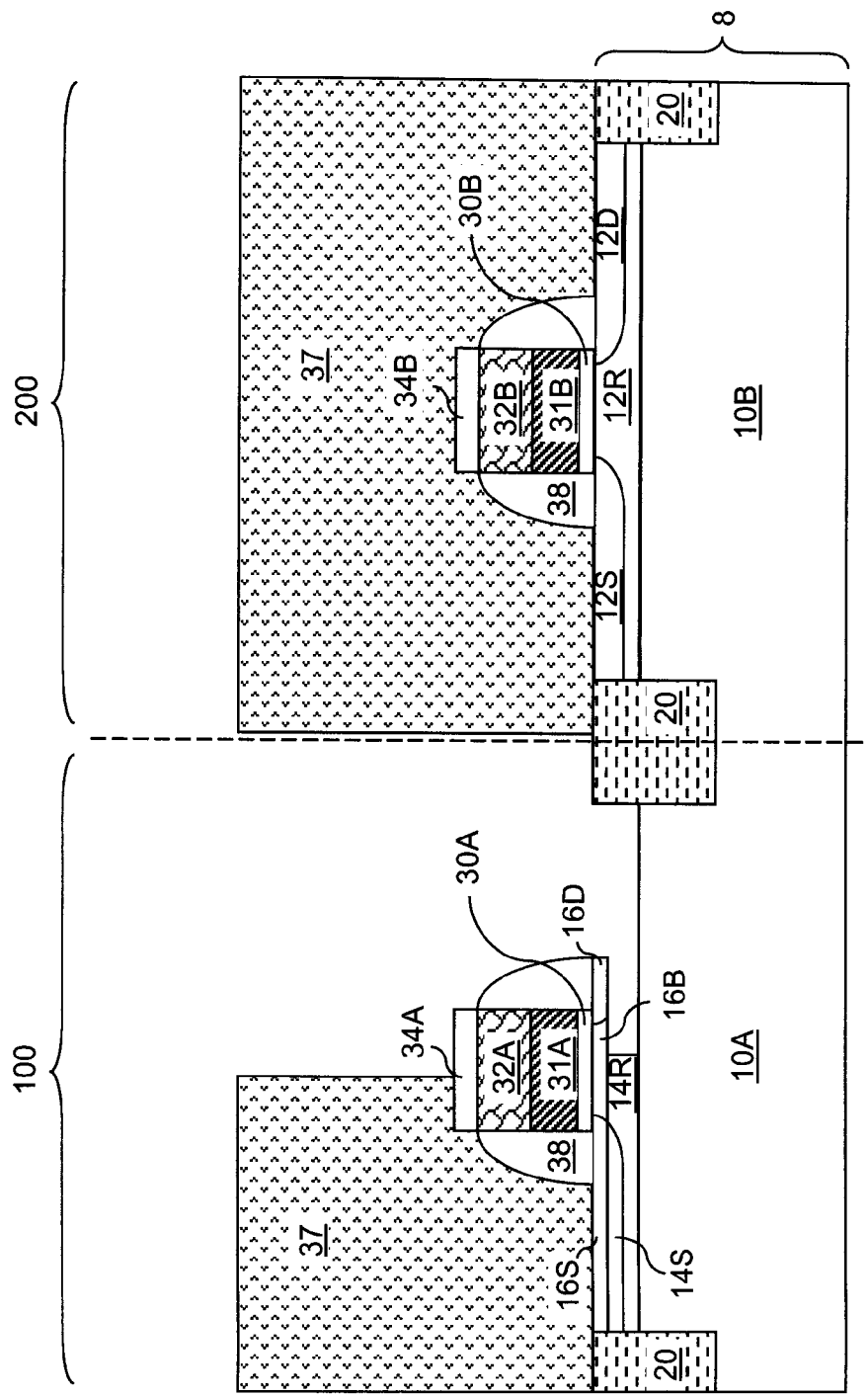
FIG. 18 is a vertical cross-sectional view of the second exemplary semiconductor structure after removal of an exposed portion of the epitaxial silicon-germanium layer by a selective etch according to the second embodiment of the present invention.

Referring to FIG. 18, a recessed region is formed within the semiconductor substrate 8 on the drain side of the first gate stack (30A, 31A, 32A, 34A) by etching the silicon-germanium alloy material in the intermediate doped SiGe drain portion 14D and the portion of the remainder epitaxial silicon-germanium portion 14R that is adjacent to the intermediate doped SiGe drain portion 14D selective to silicon. Methods of etching a silicon-germanium alloy selective to silicon are known in the art. After removing the intermediate doped SiGe drain portion 14D, the selective etch laterally proceeds to reduce the size of the remainder epitaxial silicon-germanium portion 14R. The lateral distance between an edge of the remainder epitaxial silicon-germanium portion 14R and a sidewall of the first gate electric 30A can be from 20% to 80% of the gate length, i.e., the distance between two opposing sidewalls of the first gate dielectric 30A as shown in FIG. 18. Thus, a portion of the remainder epitaxial silicon-germanium portion 14R is located underneath the first gate dielectric 30A. The masking layer 37 is subsequently removed selective to the semiconductor materials and the dielectric materials of the dielectric gate caps (34A, 34B), dielectric gate spacers 38, and the isolation structures 20.

Figure 19:
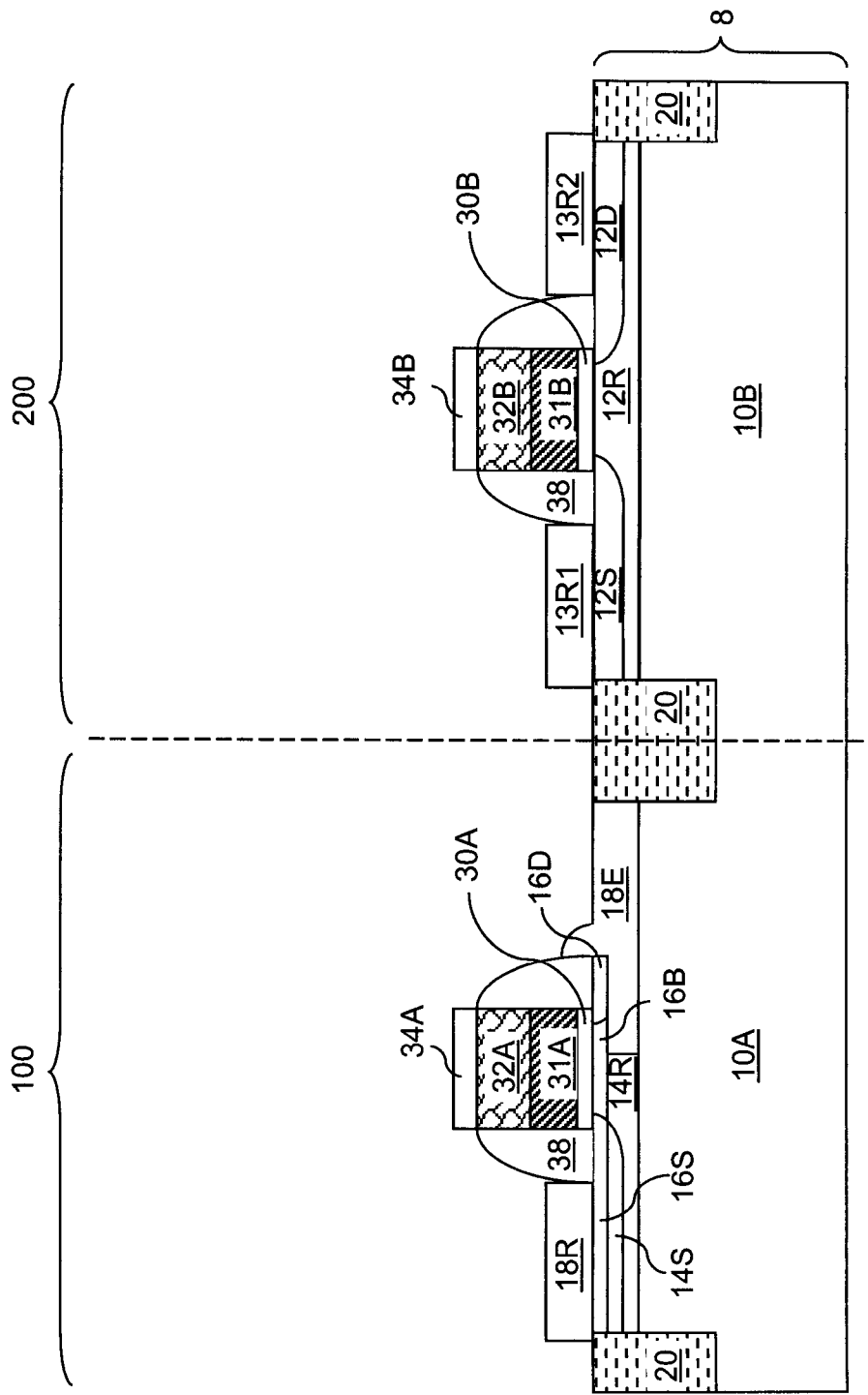
FIG. 19 is a vertical cross-sectional view of the second exemplary semiconductor structure after selective epitaxy of silicon according to the second embodiment of the present invention.

Referring to FIG. 19, a drain-side epitaxial silicon portion 18E is formed by filling the recessed region on the drain side of the first gate stack (30A, 31A, 32A, 34A) by employing selective epitaxy of silicon. The selective epitaxy can be performed without in-situ doping so that intrinsic silicon is deposited during the selective epitaxy, or can be performed with a low level doping with dopants of the first conductivity type. Because silicon is deposited on semiconductor surfaces, a first raised Si portion 18R is formed on the top surface of the first doped epitaxial-Si source portion 16S, a second raised Si portion 13R1 is formed on the top surface of the second doped epitaxial-Si source portion 12S, and a third raised Si portion 13R2 is formed on the top surface of the second doped epitaxial-Si drain region 12D. Preferably, the thickness of the drain-side epitaxial silicon portion 18E as measured in portions having a planar top surface and a planar bottom surface is substantially the same as the vertical distance between the top surface of the first doped silicon portion 10A and the first gate dielectric 30A.

Figure 20:
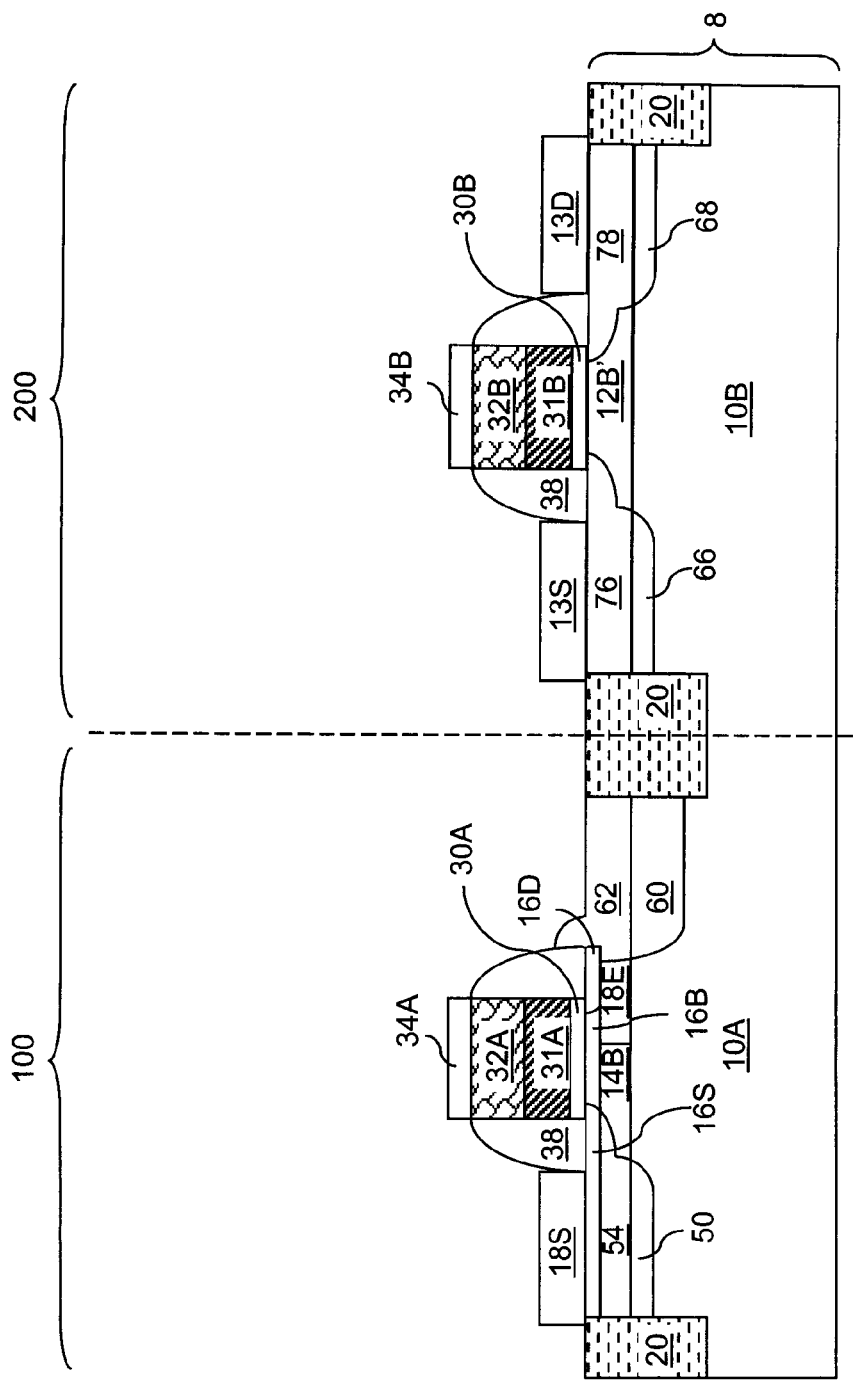
FIG. 20 is a vertical cross-sectional view of the second exemplary semiconductor structure after formation of source and drain regions according to the second embodiment of the present invention.

Referring to FIG. 20, multiple steps of masked deep source and drain ion implantation are performed to implant dopants into the semiconductor substrate 8 such that source and drain regions self-aligned to the first gate stack (30A, 31A, 32A, 34A) and the second gate stack (30B, 31B, 32B, 34B) are formed within the semiconductor substrate 8. Specifically, dopants of the second conductivity type are implanted into the first region 100 during the masked deep source and drain ion implantation to form a first source region and a first drain region. The first source region includes a first raised doped Si source portion 18S, the first doped epitaxial-Si source portion 16S, a doped SiGe source portion 54, and a first buried Si source portion 50. The first drain region includes the doped epitaxial-Si drain portion 16D, a first epitaxial-Si drain portion 62, and a first buried Si drain portion 60. Each of the first raised doped Si source portion 18S, the first doped epitaxial-Si source portion 16S, the first buried Si source portion 50, the doped epitaxial-Si drain portion 16D, the first epitaxial-Si drain portion 62, and the first buried Si drain portion 60 is composed of doped single crystalline silicon having a doping of the second conductivity type. The doped SiGe source portion 54 is composed of doped single crystalline silicon-germanium alloy having a doping of the second conductivity type.

Dopants of the first conductivity type are implanted into the second region 200 during the masked deep source and drain ion implantation to form a second source region and a second drain region. The first source region includes a second raised doped Si source portion 13S, a second doped epitaxial-Si source portion 76, and a second buried Si source portion 66. The second drain region includes a raised doped Si drain portion 13D, a second doped epitaxial-Si drain portion 78, and a second buried Si drain portion 68. Each of the second raised doped Si source portion 13S, the second doped epitaxial-Si source portion 76, the second buried Si source portion 66, the raised doped Si drain portion 13D, the second doped epitaxial-Si drain portion 78, and the second buried Si drain portion 68 is composed of doped single crystalline silicon having a doping of the first conductivity type.

The portion of the remainder epitaxial silicon-germanium portion 14R that is not implanted during the deep source and drain ion implantation is herein referred to as a buried SiGe body portion 14B. The portion of the drain-side epitaxial silicon portion 18E that is not implanted during the deep source and drain ion implantation is herein referred to as a drain-side Si body portion. The portion of the first doped Si portion 10A that is not implanted during the deep source and drain ion implantation is herein referred to as a first underlying body portion. The upper Si body portion 16B, the buried SiGe body portion 14B, the drain-side Si body portion 18E, and the first underlying body portion 10A collectively constitute the body region of a first field effect transistor located in the first region 100. The entirety of the body region of the first field effect transistor has a doping of the first conductivity type.

The portion of the remainder epitaxial silicon portion 12R that is not implanted during the deep source and drain implantation is herein referred to as an upper body portion 12B. The portion of the second doped Si portion 10B that is not implanted during the deep source and drain ion implantation is herein referred to as a second underlying body portion. The upper body portion 12B and the second underlying body portion 10B collectively constitute the body region of a second field effect transistor located in the second region 200. The entirety of the body region of the second field effect transistor has a doping of the second conductivity type. All semiconductor materials within the semiconductor substrate is single crystalline, i.e., epitaxially aligned.

Figure 21:
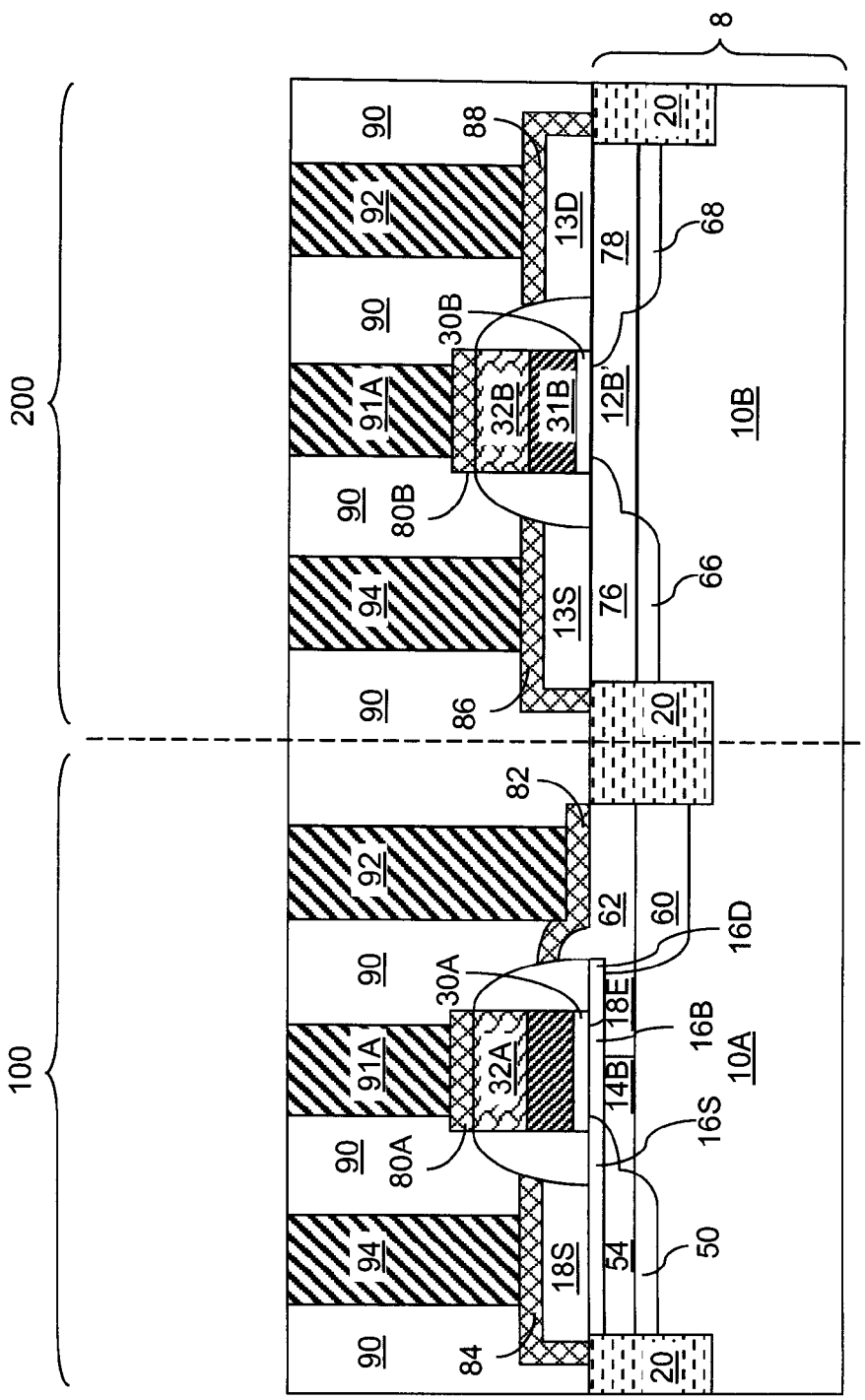
FIG. 21 is a vertical cross-sectional view of the second exemplary semiconductor structure after formation of metal semiconductor alloy portions, a dielectric material layer, and contact via structures according to the second embodiment of the present invention.

Referring to FIG. 21, the dielectric gate caps (34A, 34B) are removed and metal semiconductor alloys can be formed on exposed semiconductor surfaces, for example, by depositing a metal layer and inducing a reacting between the metal layer and the underlying semiconductor material. For example, a first source-side metal semiconductor alloy portion 84 can be formed directly on the first raised doped Si source portion 18S, a first drain-side metal semiconductor alloy portion 82 can be formed directly on the first epitaxial-Si drain portion 62, and a first gate-side metal semiconductor alloy portion 80A can be formed directly on the first gate semiconductor portion 32A. Likewise, a second source-side metal semiconductor alloy portion 86 can be formed directly on the second doped epitaxial-Si source portion 76, a second drain-side metal semiconductor alloy portion 88 can be formed directly on the second doped epitaxial-Si drain portion 78, and a second gate-side metal semiconductor alloy portion 80B can be formed directly on the second gate semiconductor portion 32B. The first source-side metal semiconductor alloy portion 84 is a germano-silicide of a metal, while the first drain-side metal semiconductor alloy portion 82, the second source-side metal semiconductor alloy portion 86, and second drain-side metal semiconductor alloy portion 88 are silicide of a metal and do not include germanium.

A dielectric material layer 90 is deposited over the semiconductor substrate 8, the various metal semiconductor alloy portions (84, 82, 80A, 86, 88, 80B), and the dielectric gate spacers 38. The dielectric material layer 90 includes a dielectric material such as undoped silicate glass, doped silicate glass, organosilicate glass (OSG), or a porous dielectric material. In one embodiment, the dielectric material layer 90 can include a porous or non-porous low dielectric constant (low-k) material having a dielectric constant less than 2.7. Via cavities are formed within the dielectric material layer 90, and are subsequently filled with a conductive material to form various contact structures as in the first embodiment.

Figure 22:
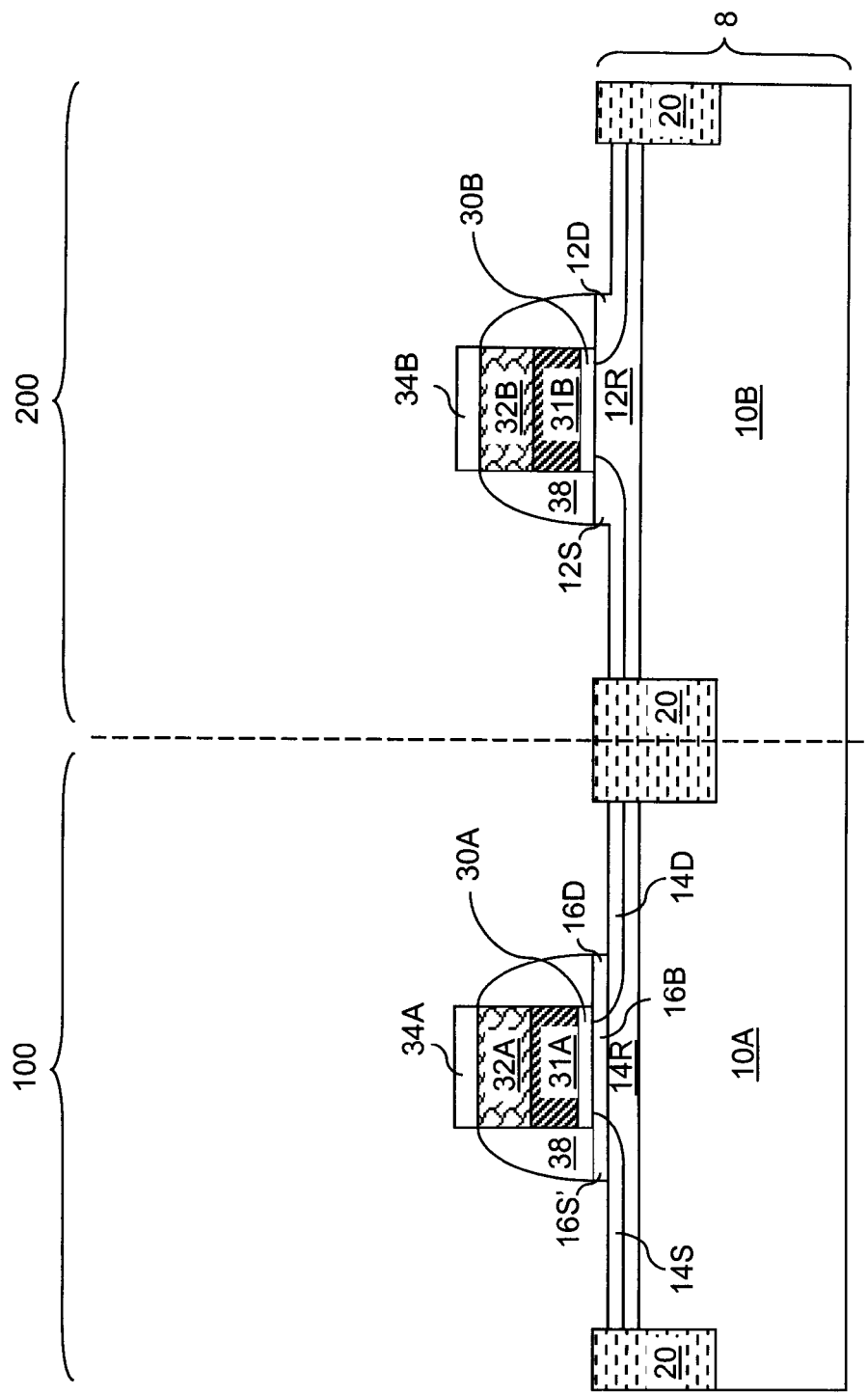
FIG. 22 is a vertical cross-sectional view of a third exemplary semiconductor structure after removal of exposed portions of the second epitaxial silicon layer and the first epitaxial silicon layer according to a third embodiment of the present invention.

Referring to FIG. 22, a third exemplary semiconductor according to a third embodiment of the present invention is derived from the second exemplary semiconductor structure of FIG. 16 by etching the exposed portions of the semiconductor material employing the etching step of FIG. 17 without employing a masking layer. The silicon material in the first doped epitaxial-Si source portion 16S, the extension-side epitaxial-Si drain portion 16D, an upper portion of the second doped epitaxial-Si source portion 12S, and a portion of the second doped epitaxial-Si drain region 12D is removed by the etch. The etch can be an isotropic etch such as a wet etch or an anisotropic etch such as a reactive ion etch. A top surface of the intermediate doped SiGe source portion 14S and a top surface of the intermediate doped SiGe drain portion 14D are exposed after the etch. The remaining portion of the first doped epitaxial-Si source portion 16S is herein referred to as an extension-side epitaxial-Si source portion 16S'. In case the etch is an anisotropic etch, a sidewall of the remaining portion of the extension-side epitaxial-Si drain portion 16D is vertically coincident with an outer sidewall of the dielectric gate spacer 38 in the first region 100, and a sidewall of the extension-side epitaxial-Si source portion 16S' is vertically coincident with another outer sidewall of the dielectric gate spacer 38 in the first region 100

Figure 23:
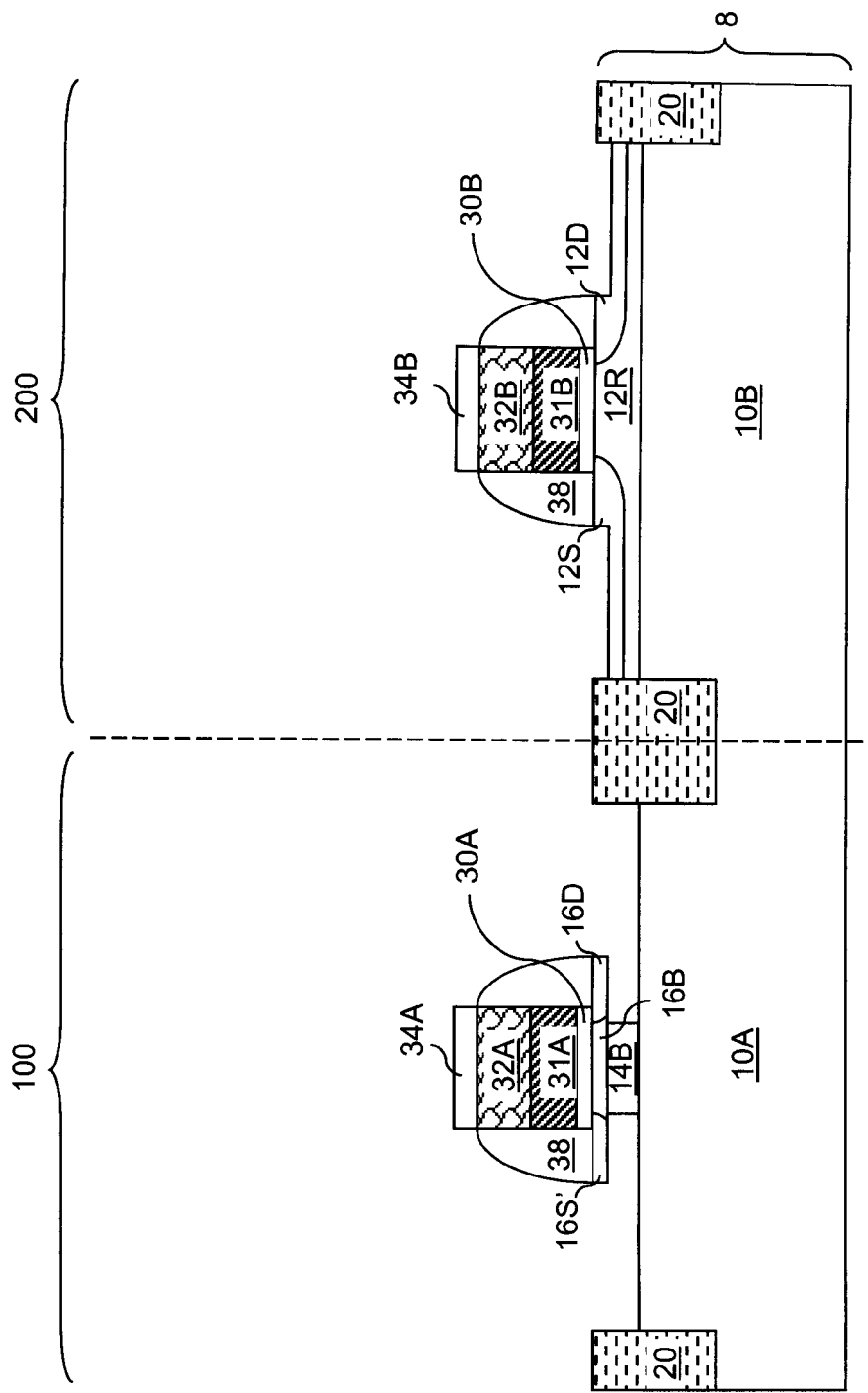
FIG. 23 is a vertical cross-sectional view of the third exemplary semiconductor structure after removal of exposed portions of the epitaxial silicon-germanium layer by a selective etch according to the third embodiment of the present invention.

Referring to FIG. 23, recessed regions are formed within the semiconductor substrate 8 on the source side and on the drain side of the first gate stack (30A, 31A, 32A, 34A) by etching, selective to silicon, the silicon-germanium alloy material in the intermediate doped SiGe source portion 14S and the intermediate doped SiGe drain portion 14D and the portions of the remainder epitaxial silicon-germanium portion 14R that are adjacent to the intermediate doped SiGe source portion 14S and the intermediate doped SiGe drain portion 14D. Methods of etching a silicon-germanium alloy selective to silicon are known in the art. After removing the intermediate doped SiGe source portion 14S and the intermediate doped SiGe drain portion 14D, the selective etch laterally proceeds to reduce the size of the remainder epitaxial silicon-germanium portion 14R. The lateral extent of the remainder epitaxial silicon-germanium portion 14R is between two opposing sidewalls of the first gate dielectric 30A as shown in FIG. 23. Thus, the entirety of the remainder epitaxial silicon-germanium portion 14R is located underneath the first gate dielectric 30A.

Figure 24:
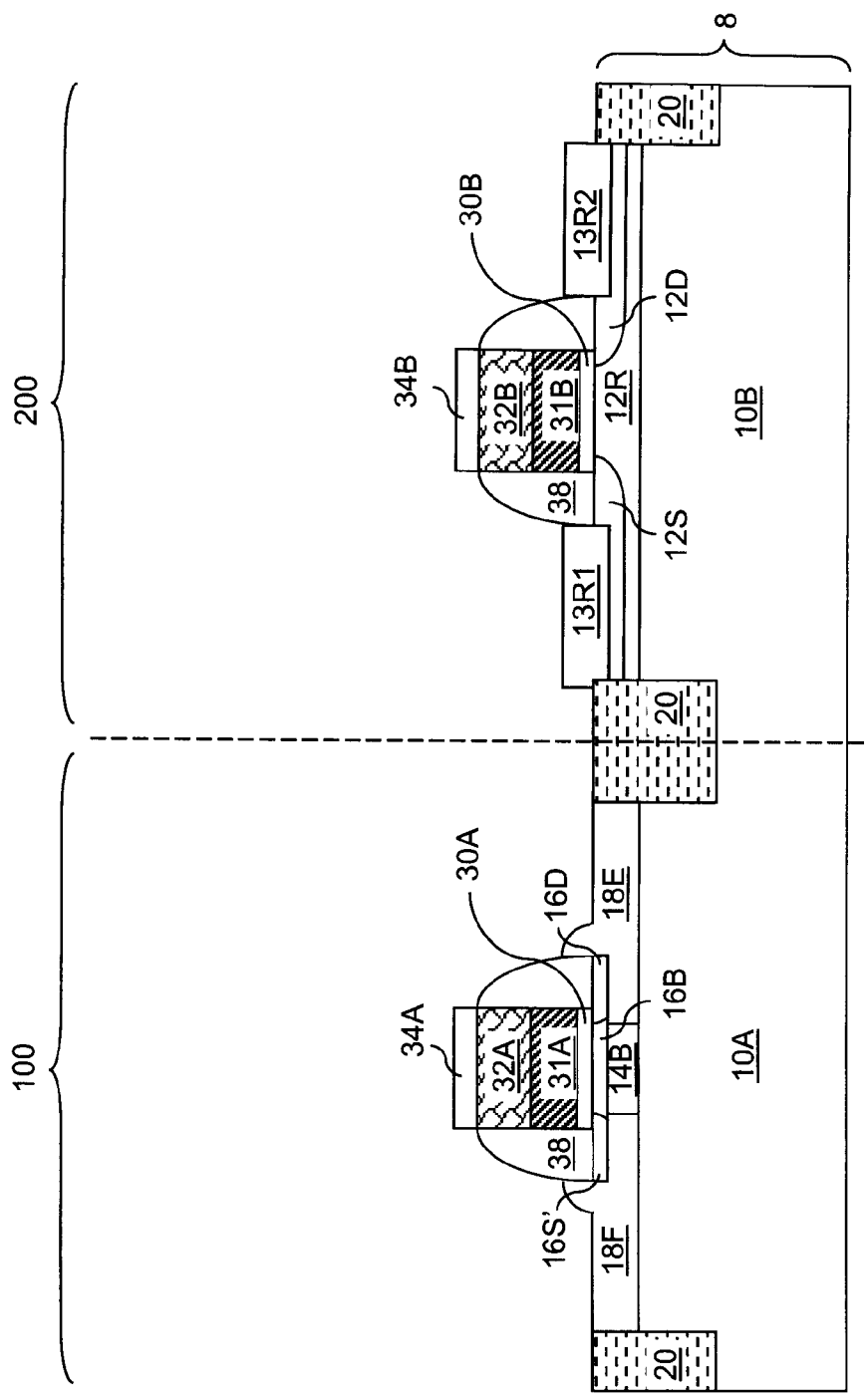
FIG. 24 is a vertical cross-sectional view of the third exemplary semiconductor structure after selective epitaxy of silicon according to the third embodiment of the present invention.

Referring to FIG. 24, a source-side epitaxial silicon portion 18F and a drain-side epitaxial silicon portion 18E are formed by filling the recessed regions on the source side and the drain side of the first gate stack (30A, 31A, 32A, 34A), respectively, by employing selective epitaxy of silicon. The selective epitaxy can be performed without in-situ doping so that intrinsic silicon is deposited during the selective epitaxy, or can be performed with a low level doping with dopants of the first conductivity type. Because silicon is deposited on semiconductor surfaces, a raised Si portion 13R1 is formed on the top surface of the second doped epitaxial-Si source portion 12S, and another raised Si portion 13R2 is formed on the top surface of the second doped epitaxial-Si drain region 12D. Preferably, the thickness of the source-side epitaxial silicon portion 18F and the drain-side epitaxial silicon portion 18E as measured in portions having a planar top surface and a planar bottom surface is substantially the same as the vertical distance between the top surface of the first doped silicon portion 10A and the first gate dielectric 30A.

Figure 25:
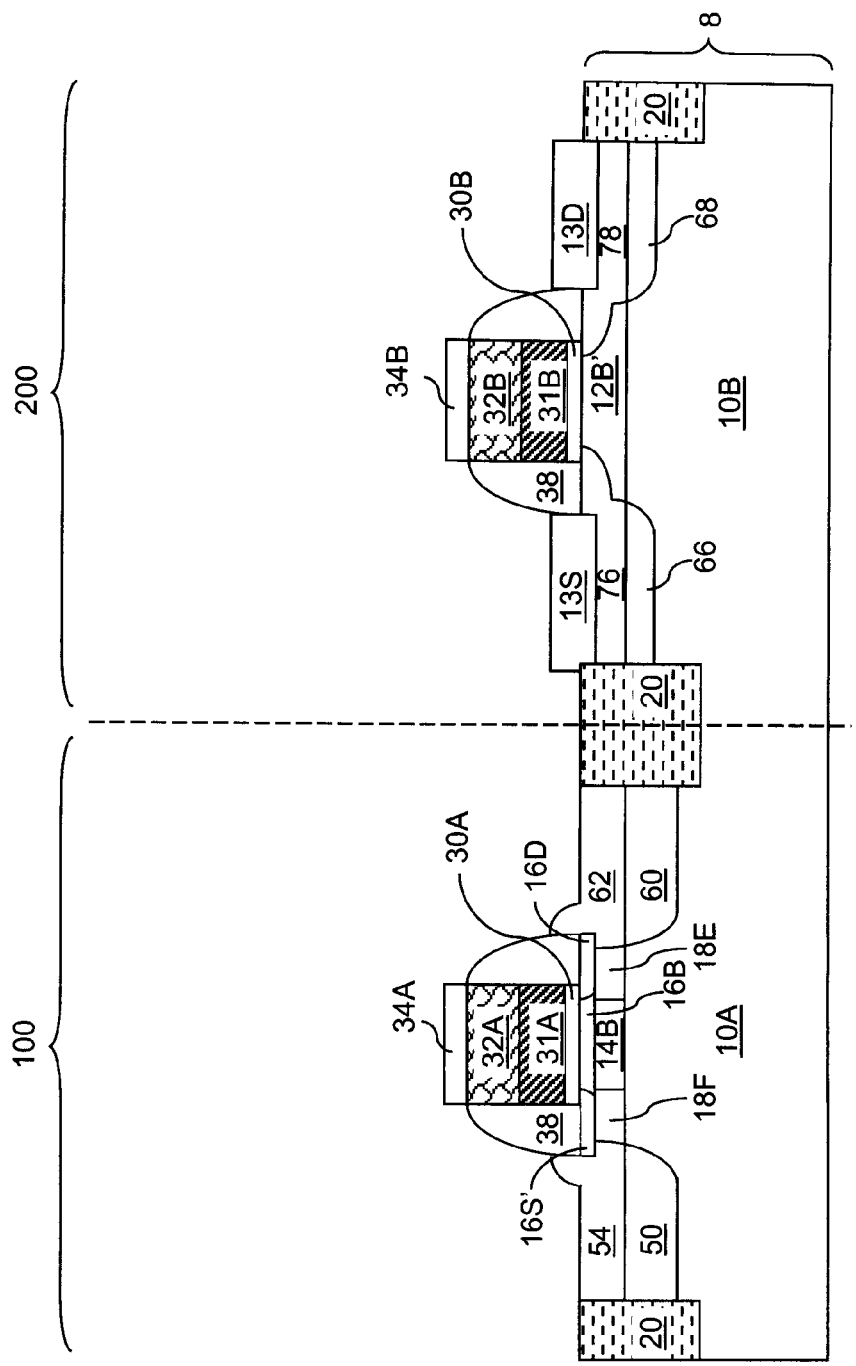
FIG. 25 is a vertical cross-sectional view of the third exemplary semiconductor structure after formation of source and drain regions according to the second embodiment of the present invention.

Referring to FIG. 25, multiple steps of masked deep source and drain ion implantation are performed to implant dopants into the semiconductor substrate 8 such that source and drain regions self-aligned to the first gate stack (30A, 31A, 32A, 34A) and the second gate stack (30B, 31B, 32B, 34B) are formed within the semiconductor substrate 8. Specifically, dopants of the second conductivity type are implanted into the first region 100 during the masked deep source and drain ion implantation to form a first source region and a first drain region. The first source region includes the extension-side epitaxial-Si source portion 16S', a first epitaxial-Si source portion 54, and a first buried Si source portion 50. The first drain region includes the doped epitaxial-Si drain portion 16D, a first epitaxial-Si drain portion 62, and a first buried Si drain portion 60. Each of the extension-side epitaxial-Si source portion 16S', the first epitaxial-Si source portion 54, and the first buried Si source portion 50, the doped epitaxial-Si drain portion 16D, the first epitaxial-Si drain portion 62, and the first buried Si drain portion 60 is composed of doped single crystalline silicon having a doping of the second conductivity type.

Dopants of the first conductivity type are implanted into the second region 200 during the masked deep source and drain ion implantation to form a second source region and a second drain region. The first source region includes a second raised doped Si source portion 13S, a second doped epitaxial-Si source portion 76, and a second buried Si source portion 66. The second drain region includes a raised doped Si drain portion 13D, a second doped epitaxial-Si drain portion 78, and a second buried Si drain portion 68. Each of the second raised doped Si source portion 13S, the second doped epitaxial-Si source portion 76, the second buried Si source portion 66, the raised doped Si drain portion 13D, the second doped epitaxial-Si drain portion 78, and the second buried Si drain portion 68 is composed of doped single crystalline silicon having a doping of the first conductivity type.

The portion of the source-side epitaxial silicon portion 18F that is not implanted during the deep source and drain ion implantation is herein referred to as a source-side Si body portion. The portion of the drain-side epitaxial silicon portion 18E that is not implanted during the deep source and drain ion implantation is herein referred to as a drain-side Si body portion. The portion of the first doped Si portion 10A that is not implanted during the deep source and drain ion implantation is herein referred to as a first underlying body portion. The upper Si body portion 16B, the source-side Si body portion 18F, the buried SiGe body portion 14B, the drain-side Si body portion 18E, and the first underlying body portion 10A collectively constitute the body region of a first field effect transistor located in the first region 100. The entirety of the body region of the first field effect transistor has a doping of the first conductivity type.

The portion of the remainder epitaxial silicon portion 12R that is not implanted during the deep source and drain implantation is herein referred to as an upper body portion 12B. The portion of the second doped Si portion 10B that is not implanted during the deep source and drain ion implantation is herein referred to as a second underlying body portion. The upper body portion 12B and the second underlying body portion 10B collectively constitute the body region of a second field effect transistor located in the second region 200. The entirety of the body region of the second field effect transistor has a doping of the second conductivity type. All semiconductor materials within the semiconductor substrate is single crystalline, i.e., epitaxially aligned.

Figure 26:
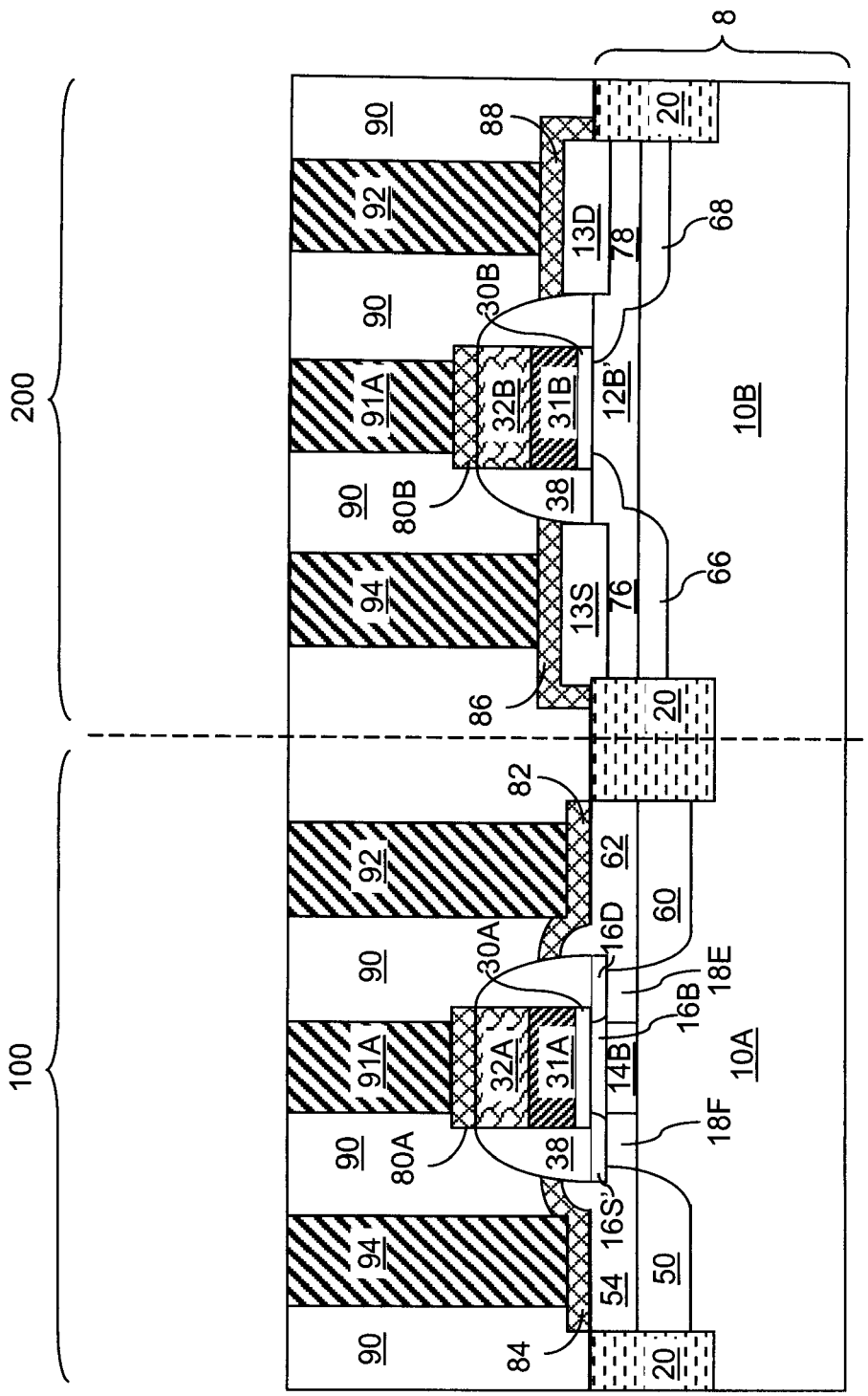
FIG. 26 is a vertical cross-sectional view of the third exemplary semiconductor structure after formation of metal semiconductor alloy portions, a dielectric material layer, and contact via structures according to the third embodiment of the present invention.

Referring to FIG. 26, the dielectric gate caps (34A, 34B) are removed and metal semiconductor alloys can be formed on exposed semiconductor surfaces as described above. A dielectric material layer 90 is deposited over the semiconductor substrate 8, the various metal semiconductor alloy portions (84, 82, 80A, 86, 88, 80B), and the dielectric gate spacers 38. The dielectric material layer 90 includes a dielectric material such as undoped silicate glass, doped silicate glass, organosilicate glass (OSG), or a porous dielectric material. In one embodiment, the dielectric material layer 90 can include a porous or non-porous low dielectric constant (low-k) material having a dielectric constant less than 2.7. Via cavities are formed within the dielectric material layer 90, and are subsequently filled with a conductive material to form various contact structures as in the first embodiment.

The first field effect transistor in the first region 100 in the various embodiments of the present invention provides the first advantage of reduced band gap for the purpose of controlling the on-current due to a silicon-germanium alloy portion located on one side of the channel in the body region, while simultaneously providing the second advantage of reduction in GIDL current during the off-state of the transistor, thereby reducing the power consumption while the first field effect transistor is turned off. It is understood that multiple instances of the first field effect transistor can be formed on the same semiconductor substrate with or without second field effect transistor(s) formed in the second region 200 in the various embodiments.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising a field effect transistor and another field effect transistor, said field effect transistor comprising a body region including:
    a buried SiGe body portion;
    an upper Si body portion contacting an upper surface of said buried SiGe body portion;
    a source-side Si body portion laterally contacting said buried SiGe body portion and a source region;
    a drain-side Si body portion laterally contacting said buried SiGe body portion and a drain region; and
    an underlying body portion located beneath said buried SiGe body portion, said source-side Si body portion, and said drain-side Si body portion,
    wherein said another field effect transistor comprises another body region, wherein an entirety of said another body region has dopants of the opposite polarity from dopants in said body region, and an entirety of said another body region is a doped silicon region that does not include germanium.

2. The semiconductor structure of claim 1, wherein said source region includes a source extension portion contacting one edge of a bottom surface of a gate dielectric of said field effect transistor, and said drain region includes a drain extension portion contacting another edge of said bottom surface of said gate dielectric of said field effect transistor.

3. The semiconductor structure of claim 2, wherein bottom surfaces of said source extension portion and said drain extension portion are on a same horizontal plane as a top surface of said buried SiGe body portion.

4. The semiconductor structure of claim 1, wherein said buried SiGe body portion is not in contact with said drain region.

5. The semiconductor structure of claim 1, wherein said source region includes an extension-side epitaxial-Si source portion that has a planar bottom surface that contacts said source-side Si body portion.

6. The semiconductor structure of claim 5, wherein said drain region includes an extension-side epitaxial-Si drain portion that has a planar bottom surface that contacts said drain-side Si body portion.

7. The semiconductor structure of claim 1, wherein a bottommost surface of said buried SiGe body portion is coplanar with a bottommost surface of said source-side Si body portion.

8. The semiconductor structure of claim 1, wherein a bottommost surface of said buried SiGe body portion is coplanar with a bottommost surface of said drain-side Si body portion.

9. The semiconductor structure of claim 1, wherein an interface between said buried SiGe body portion and said source-side Si body portion underlies an area of a gate dielectric of said field effect transistor.

10. The semiconductor structure of claim 1, wherein an interface between said buried SiGe body portion and said drain-side Si body portion underlies an area of a gate dielectric of said field effect transistor.

11. A semiconductor structure comprising a field effect transistor and another field effect transistor, said field effect transistor comprising a body region including:
a buried SiGe body portion;
an upper Si body portion contacting an upper surface of said buried SiGe body portion;
a source-side Si body portion laterally contacting said buried SiGe body portion and a source region, wherein said buried SiGe body portion is not in contact with said source region;
a drain-side Si body portion laterally contacting said buried SiGe body portion and a drain region; and
an underlying body portion located beneath said buried SiGe body portion, said source-side Si body portion, and said drain-side Si body portion,
wherein said another field effect transistor comprises another body region, wherein an entirety of said another body region has dopants of the opposite polarity from dopants in said body region, and an entirety of said another body region is a doped silicon region that does not include germanium.

12. The semiconductor structure of claim 11, wherein said source region includes a source extension portion contacting one edge of a bottom surface of a gate dielectric of said field effect transistor, and said drain region includes a drain extension portion contacting another edge of said bottom surface of said gate dielectric of said field effect transistor.

13. The semiconductor structure of claim 12, wherein bottom surfaces of said source extension portion and said drain extension portion are on a same horizontal plane as a top surface of said buried SiGe body portion.

14. The semiconductor structure of claim 11, wherein said buried SiGe body portion is not in contact with said drain region or.

15. The semiconductor structure of claim 11, wherein said source region includes an extension-side epitaxial-Si source portion that has a planar bottom surface that contacts said source-side Si body portion, and said drain region includes an extension-side epitaxial-Si drain portion that has a planar bottom surface that contacts said drain-side Si body portion.

16. The semiconductor structure of claim 11, wherein a bottommost surface of said buried SiGe body portion is coplanar with a bottommost surface of said source-side Si body portion.

17. The semiconductor structure of claim 11, wherein a bottommost surface of said buried SiGe body portion is coplanar with a bottommost surface of said drain-side Si body portion.

18. The semiconductor structure of claim 11, wherein a first interface between said buried SiGe body portion and said source-side Si body portion underlies an area of a gate dielectric of said field effect transistor, and a second interface between said buried SiGe body portion and said drain-side Si body portion underlies said area of said gate dielectric of said field effect transistor.

19. A semiconductor structure comprising a field effect transistor and another field effect transistor, said field effect transistor comprising a body region including:
a buried SiGe body portion;
an upper Si body portion contacting an upper surface of said buried SiGe body portion;
a source-side Si body portion laterally contacting said buried SiGe body portion and a source region;
a drain-side Si body portion laterally contacting said buried SiGe body portion and a drain region; and
an underlying body portion located beneath said buried SiGe body portion, said source-side Si body portion, and said drain-side Si body portion,
wherein said another field effect transistor comprises another body region, wherein an entirety of said another body region has dopants of the opposite polarity from dopants in said body region, and an entirety of said another body region is a doped silicon region that does not include germanium, wherein a bottommost surface of said buried SiGe body portion is coplanar with a bottommost surface of said source-side Si body portion, and a bottommost surface of said buried SiGe body portion is coplanar with a bottommost surface of said drain-side Si body portion.

20. The semiconductor structure of claim 19, wherein an interface between said buried SiGe body portion and said source-side Si body portion underlies an area of a gate dielectric of said field effect transistor, and an interface between said buried SiGe body portion and said drain-side Si body portion underlies another area of said gate dielectric of said field effect transistor.

* * * * *